US012029014B2

(12) United States Patent
Yoon et al.

(10) Patent No.: US 12,029,014 B2
(45) Date of Patent: Jul. 2, 2024

(54) WEARABLE ELECTRONIC DEVICE INCLUDING HEAT RADIATION STRUCTURE

(71) Applicant: SAMSUNG ELECTRONICS CO., LTD., Suwon-si (KR)

(72) Inventors: Youngho Yoon, Suwon-si (KR); Yonghyun Park, Suwon-si (KR); Jungkeun Lee, Suwon-si (KR); Sangchul Jung, Suwon-si (KR); Chunsik Choi, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 285 days.

(21) Appl. No.: 17/422,612

(22) PCT Filed: Jul. 7, 2021

(86) PCT No.: PCT/KR2021/008672
§ 371 (c)(1),
(2) Date: Jul. 13, 2021

(87) PCT Pub. No.: WO2022/059893
PCT Pub. Date: Mar. 24, 2022

(65) Prior Publication Data
US 2022/0346277 A1    Oct. 27, 2022

(30) Foreign Application Priority Data
Sep. 15, 2020  (KR) .......................... 10-2020-0118172

(51) Int. Cl.
*H05K 7/20*    (2006.01)
*G02B 27/01*    (2006.01)

(52) U.S. Cl.
CPC ..... *H05K 7/20336* (2013.01); *G02B 27/0176* (2013.01); *H05K 7/20981* (2013.01); *G02B 2027/0178* (2013.01)

(58) Field of Classification Search
CPC ............... G02B 27/008; G02B 27/017; G02B 27/0176; G02B 2027/0152;
(Continued)

(56) References Cited

U.S. PATENT DOCUMENTS 5,938,096 A    8/1999  Sauer
7,312,988 B2 * 12/2007  Maeda ................... F21V 29/67
                                                361/679.48
(Continued)

FOREIGN PATENT DOCUMENTS

CN    107870423    4/2018
CN    110398839    11/2019
(Continued)

OTHER PUBLICATIONS

International Search Report and Written Opinion dated Oct. 26, 2021 in corresponding International Application No. PCT/KR2021/008672.
(Continued)

*Primary Examiner* — Robert J Hoffberg
(74) *Attorney, Agent, or Firm* — Nixon & Vanderhye, P.C.

(57) ABSTRACT

A wearable electronic device according to various embodiments of the disclosure includes: a housing including a first housing part in which a processor is received and a second housing part in which a display is received, and a hinge connecting the first housing part and the second housing part and having a hole provided in an area in communication with an outside of the wearable electronic device. At least (Continued)

part of heat generated from the processor is radiated to the outside through the hinge having the hole formed therein.

15 Claims, 16 Drawing Sheets

(58) Field of Classification Search
CPC .............. G02B 2027/0178; G02B 6/0085; G02B 1/04; H05K 7/1427; H05K 7/20127; H05K 7/20136; H05K 7/20145; H05K 7/2039; H05K 7/20409; H05K 7/20418; H05K 7/20436; H05K 7/20454; H05K 7/20963; H05K 1/0201; H05K 1/0203; H05K 5/0213; H05K 5/0226; H05K 2201/066; H05K 9/0041; G06F 1/163; G06F 1/1681; G06F 1/203; G06F 3/011

See application file for complete search history.

(56) References Cited

U.S. PATENT DOCUMENTS

| | | | |
|---|---|---|---|
| 7,389,872 B2 * | 6/2008 | Wheeler ................ G06F 1/1628 |
| | | | 361/679.55 |
| 7,457,113 B2 * | 11/2008 | Kumhyr ................. G06F 1/203 |
| | | | 361/679.48 |
| 8,937,806 B2 * | 1/2015 | Senatori ................. G06F 1/203 |
| | | | 361/694 |
| 9,148,979 B2 | 9/2015 | Chiriac et al. |
| 9,182,794 B2 | 11/2015 | Rivera et al. |
| 9,268,377 B2 * | 2/2016 | MacDonald ............ G06F 1/203 |
| 9,529,396 B2 | 12/2016 | Shen |
| 9,545,030 B2 * | 1/2017 | Nikkhoo ................. G06F 3/011 |
| 9,585,285 B2 * | 2/2017 | Nikkhoo ................... F28F 3/08 |
| 9,703,119 B2 | 7/2017 | Cazalet |
| 9,791,704 B2 * | 10/2017 | Nikkhoo ................. G06F 1/203 |
| 9,864,419 B2 | 1/2018 | Rhee et al. |
| 9,986,667 B2 * | 5/2018 | Nikkhoo ................. G06F 1/203 |
| 10,028,418 B2 * | 7/2018 | Nikkhoo ............ H05K 7/20963 |
| 10,108,017 B2 * | 10/2018 | Nikkhoo .............. G02B 6/0085 |
| 10,416,735 B2 | 9/2019 | Ali |
| 10,444,515 B2 * | 10/2019 | Nikkhoo ............ G02B 27/0176 |
| 10,798,849 B2 * | 10/2020 | Lee ....................... G06F 1/1626 |
| 10,826,163 B2 * | 11/2020 | Moore ..................... H01Q 9/42 |
| 10,852,552 B2 | 12/2020 | Kimura et al. |
| 10,852,562 B2 | 12/2020 | Moskowitz |
| 10,860,100 B2 * | 12/2020 | Osterhout ............. G06F 3/0346 |
| 10,884,247 B2 * | 1/2021 | Lee .................... G02B 27/0176 |
| 11,047,628 B2 * | 6/2021 | Lee .................... H05K 7/20336 |
| 11,163,161 B2 * | 11/2021 | Woodman .............. H04N 23/55 |
| 11,245,782 B2 | 2/2022 | Hong |
| 11,333,905 B2 * | 5/2022 | Zhang .................. H04B 1/0064 |
| 11,422,384 B2 | 8/2022 | Moskowitz |
| 11,493,763 B2 * | 11/2022 | Lee .................... G02B 27/0172 |
| 11,555,657 B2 * | 1/2023 | Lee ....................... H04M 1/0277 |
| 11,698,542 B2 | 7/2023 | Clopp |
| 2006/0114653 A1 * | 6/2006 | Seto ........................ G06F 1/203 |
| | | | 361/679.48 |
| 2014/0098489 A1 | 4/2014 | Chiriac et al. |
| 2015/0169014 A1 | 6/2015 | Rivera et al. |
| 2015/0220122 A1 | 8/2015 | Rhee et al. |
| 2016/0048036 A1 | 2/2016 | Cazalet |
| 2016/0154442 A1 | 6/2016 | Shen |
| 2016/0209660 A1 * | 7/2016 | Nikkhoo ............... G02B 27/017 |
| 2016/0209661 A1 * | 7/2016 | Nikkhoo ............ G02B 27/0176 |
| 2016/0212886 A1 * | 7/2016 | Nikkhoo ............ H05K 7/20963 |
| 2019/0107870 A1 | 4/2019 | Ali |
| 2020/0204666 A1 | 6/2020 | Hong |
| 2023/0046364 A1 | 2/2023 | Moskowitz |
| 2023/0122743 A1 * | 4/2023 | Lee ........................ G02B 7/008 |
| | | | 361/707 |
| 2023/0288734 A1 | 9/2023 | Clopp |

FOREIGN PATENT DOCUMENTS

| | | | |
|---|---|---|---|
| CN | 110873965 | 3/2020 | |
| KR | 10-2000-0027344 | 5/2000 | |
| KR | 10-2009-0100314 | 9/2009 | |
| KR | 10-2014-0105472 | 9/2014 | |
| KR | 10-2015-0091873 | 8/2015 | |
| KR | 10-2020-0002997 | 1/2020 | |
| KR | 10-2020-0027760 | 3/2020 | |
| KR | 10-2020-0077931 | 7/2020 | |
| WO | WO-2017142286 A1 * | 8/2017 | ............... C09K 5/14 |
| WO | 2019/089785 A1 | 5/2019 | |
| WO | 2019/183550 A1 | 9/2019 | |

OTHER PUBLICATIONS

Extended Search Report dated Dec. 5, 2023 in European Patent Application No. 21869517.9.

* cited by examiner

WEARABLE ELECTRONIC DEVICE INCLUDING HEAT RADIATION STRUCTURE

CROSS REFERENCE TO RELATED APPLICATION

This application is the U.S. national phase of International Application No. PCT/KR2021/008672 filed on Jul. 7, 2021 which designated the U.S. and claims priority under 35 U.S.C. § 119 to Korean Patent Application No. 10-2020-0118172, filed on Sep. 15, 2020, in the Korean Intellectual Property Office, the disclosure of which is incorporated by reference herein in its entirety.

BACKGROUND

Field

The disclosure relates to a wearable electronic device including a heat radiation structure.

Description of Related Art

An electronic device may include components (e.g., a processor, a display, a power management integrated circuit (PMIC), and/or a memory) that generate heat while performing functions for operations of the electronic device. The electronic device may include a heat radiation structure that radiates the heat generated from the components to the outside. For example, the heat radiation structure may be implemented to decrease temperature by transferring the heat using a thermal conductor such as graphite, a vapor chamber, and/or a heat pipe.

Recently, wearable electronic devices worn on users' bodies have been widely used. For example, a wearable electronic device may include augmented reality glasses (AR glasses).

The wearable electronic device may include a hinge connecting housing parts. The hinge may be formed in part of a housing such that the part of the housing is rotatable about the hinge. In the case where the hinge is formed in the housing, it may not be easy to position a separate heat radiation structure in the wearable electronic device. In the case where the separate heat radiation structure is not disposed in the wearable electronic device, the temperatures of components of the wearable electronic device may be raised by heat generated from a component. In the case where the temperatures of the components are raised above a specified temperature, the components may be damaged, or a user may have difficulty having the wearable electronic device on.

SUMMARY

Embodiments of the disclosure provide a wearable electronic device having improved heat radiation performance in radiating heat generated from components to the outside although including a hinge.

A wearable electronic device according to an example embodiment of the disclosure includes: a housing including a first housing part in which a processor is received and a second housing part in which a display is received, and a hinge connecting the first housing part and the second housing part, the hinge including a hole provided in an area in communication with an outside of the wearable electronic device, wherein the electronic device is configured to radiate at least part of heat generated from the processor to the outside through the hinge having the hole provided therein.

A wearable electronic device according to an example embodiment of the disclosure includes: a first housing part in which a processor is received, a second housing part in which a display is received, a hinge rotatably connecting the first housing part and the second housing part, the hinge having a hole provided therein, and an flexible printed circuit board (FPCB) electrically connecting the display and the processor, wherein the FPCB is configured to bypass the hinge, and the electronic device is configured to radiate heat generated from the processor outside the wearable electronic device through the hinge having the hole provided therein.

According to various example embodiments of the disclosure, the electronic device may radiate heat generated from a component (e.g., the processor) of the electronic device to the outside using the hole included in the hinge. The hole included in the hinge (e.g., a connecting member) may serve as a heat sink that radiates heat to the outside. Accordingly, a phenomenon in which the temperature of the processor is raised above a specified temperature by the heat generated from the component (e.g., the processor) of the electronic device and therefore the component (e.g., the processor) of the electronic device is damaged may be prevented and/or reduced.

According to various example embodiments of the disclosure, heat generated from a component (e.g., the processor) of the electronic device may be rapidly transferred to the hole included in the hinge through the conductive member that connects the component (e.g., the processor) of the electronic device and the hinge. Accordingly, the electronic device having improved heat radiation performance may be implemented.

In addition, the disclosure may provide various effects that are directly or indirectly recognized.

BRIEF DESCRIPTION OF THE DRAWINGS

The above and other aspects, features and advantages of certain embodiments of the present disclosure will be more apparent from the following detailed description, taken in conjunction with the accompanying drawings, in which.

With regard to description of the drawings, identical or similar reference numerals may be used to refer to identical or similar components.

DETAILED DESCRIPTION

Hereinafter, various example embodiments of the disclosure may be described with reference to accompanying drawings. Accordingly, those of ordinary skill in the art will recognize that modifications, equivalents, and/or alternatives on the various example embodiments described herein can be variously made without departing from the scope and spirit of the disclosure.

Figure 1:
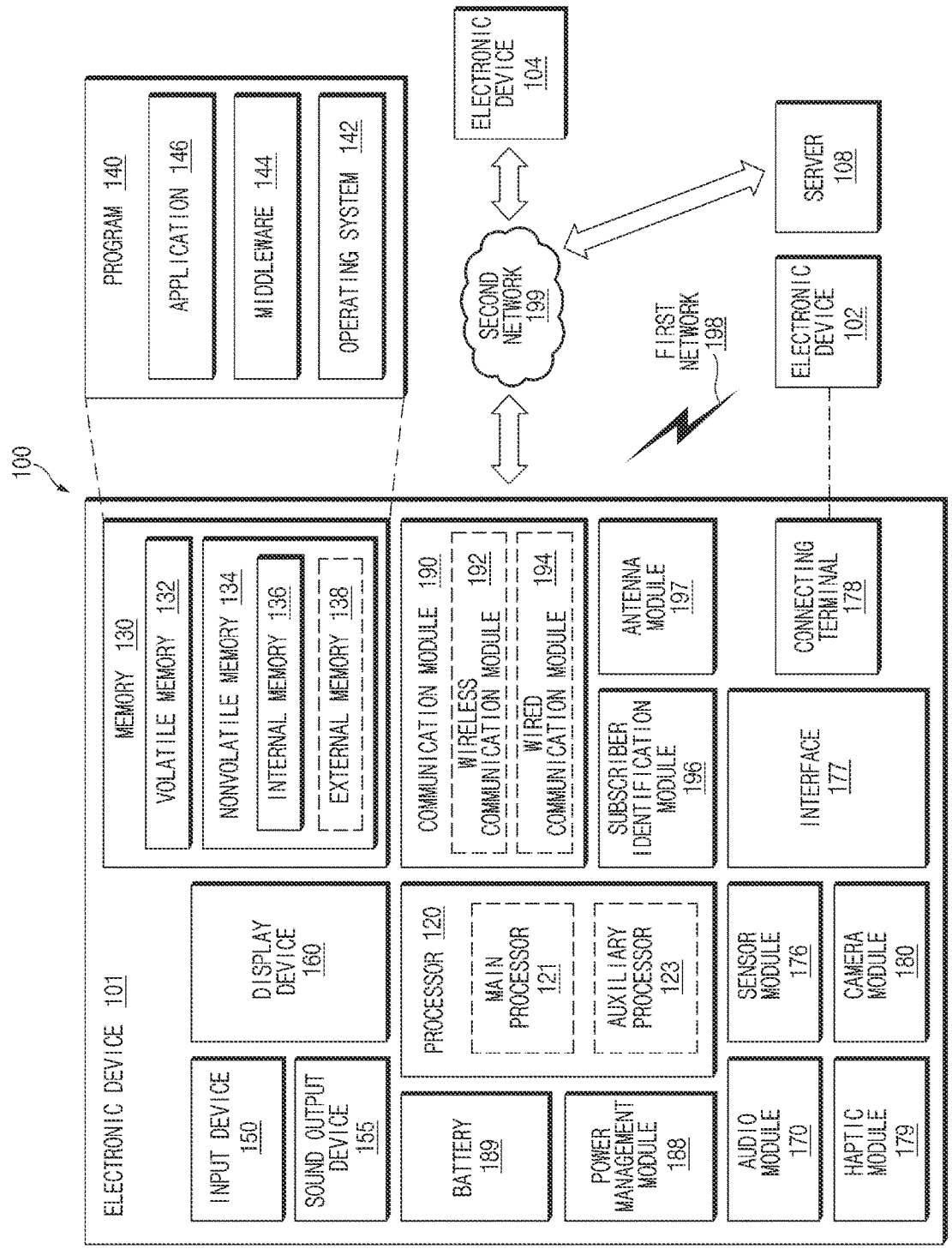
FIG. 1 is a block diagram illustrating an example electronic device in a network environment according to various embodiments.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments, at least one of the components (e.g., the connecting terminal 178) may be omitted from the electronic device 101, or one or more other components may be added in the electronic device 101. In some embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 2:
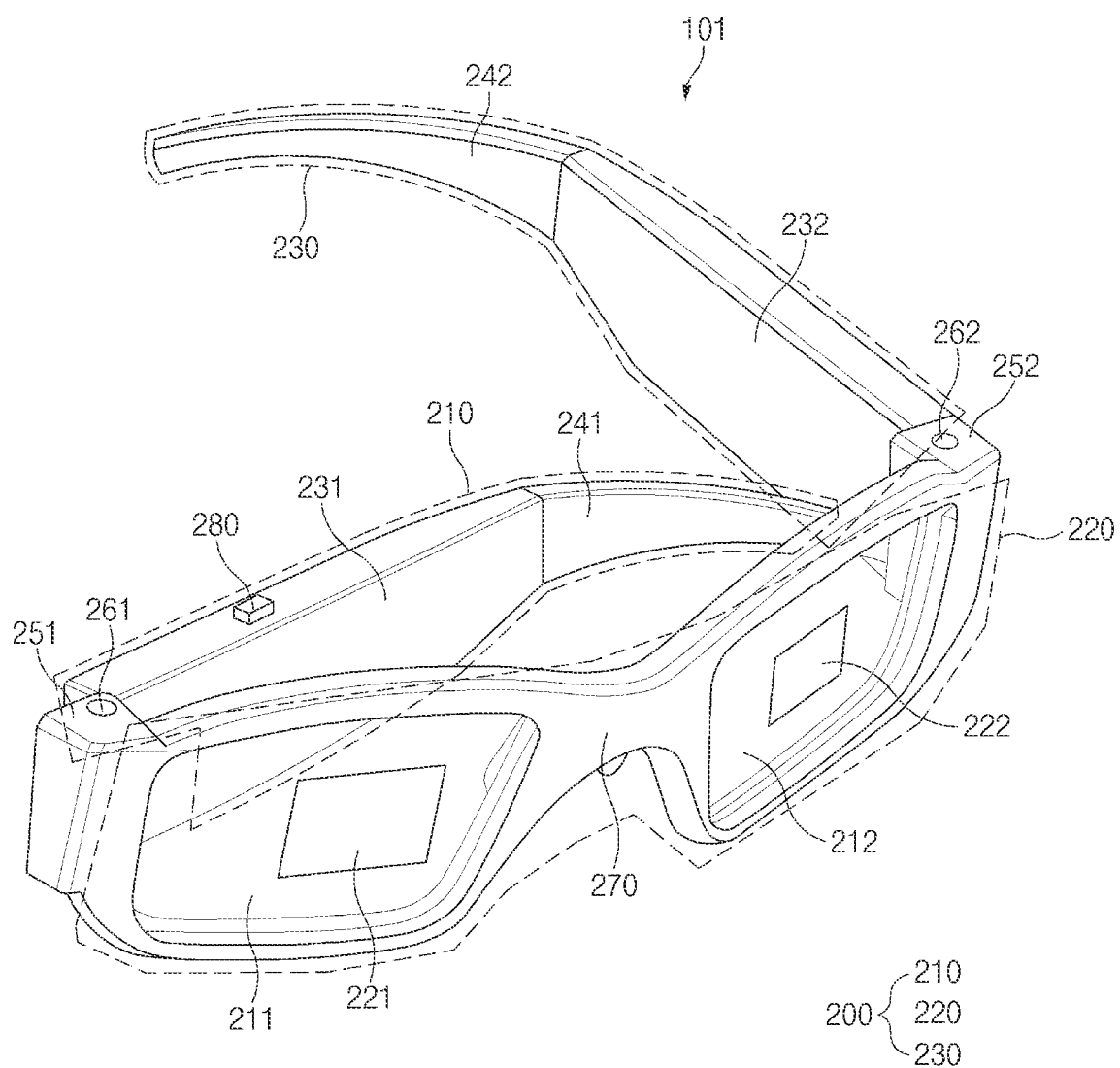
FIG. 2 is a perspective view illustrating an example wearable electronic device according to various embodiments.
Figure 3:
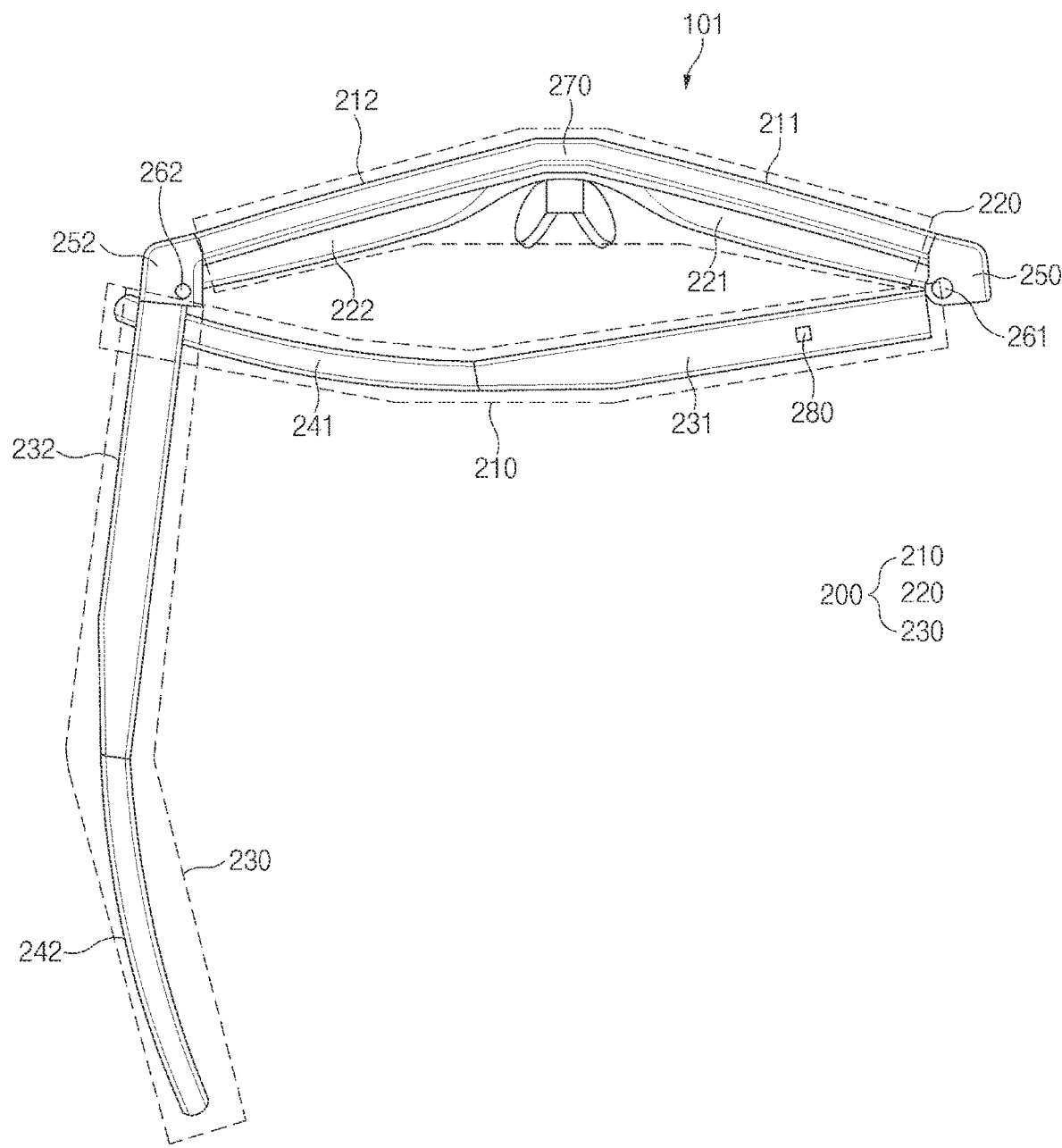
FIG. 3 is a diagram illustrating the wearable electronic device according to various embodiments.

FIG. 2 is a perspective view illustrating an example wearable electronic device 101 according to various embodiments. FIG. 3 is a plan view illustrating the wearable electronic device 101 according to various embodiments.

In an embodiment, the wearable electronic device 101 may be included in the electronic device 101 described above with reference to FIG. 1. For example, the wearable electronic device 101 may include at least some of the components of the electronic device 101 of FIG. 1. The wearable electronic device 101 may, for example, and without limitation, be smart glasses. For example, the wearable electronic device 101 may, for example, and without limitation, be augmented reality glasses (AR glasses). However, without being limited thereto, the wearable electronic device 101 may, for example, and without limitation, be an electronic device in the form of glasses, such as a virtual reality (VR) device, a mixed reality (MR) device, and/or a head mount display (HMD), or the like, which is worn on a user's face. The wearable electronic device 101 according to an embodiment may include glass lenses 211 and 212, screens 221 and 222, temples 231 and 232, temple tips 241 and 242, hinges 251 and 252, holes 261 and 262, and/or a rim 270.

In an embodiment, the wearable electronic device 101 may include a housing 200 that includes a first housing part 210, a second housing part 220, and a third housing part 230. The second housing part 220 may be located between the first housing part 210 and the third housing part 230, and the first housing part 210 and the third housing part 230 may have substantially the same form.

In an embodiment, the glass lenses 211 and 212 may be disposed on a front side of the wearable electronic device 101. The glass lenses 211 and 212 may be located in front of the user's eyes when the wearable electronic device 101 is worn on the user's face. The glass lenses 211 and 212 may include the first glass lens 211 and the second glass lens 212. The first glass lens 211 may be located in front of the user's right eye when the user has the wearable electronic device 101 on. The second glass lens 212 may be located in front of the user's left eye when the user has the wearable electronic device 101 on. The user may view the outside through the glass lenses 211 and 212 when the user has the wearable electronic device 101 on. At least parts of the glass lenses 211 and 212 may be formed of a material, such as transparent glass and/or transparent plastic, which allows light to pass.

According to an embodiment, a display module (e.g., the display module 160 of FIG. 1) may include the glass lenses 211 and 212 and may provide visual information to the user through the glass lenses 211 and 212. The wearable electronic device 101 may include the first glass lens 211 corresponding to the right eye and/or the second glass lens 212 corresponding to the left eye. According to an embodiment, the display module 160 may include a display panel and/or a lens. For example, the display panel may contain a transparent material such as glass or plastic.

According to an embodiment, the display module 160 may be disposed in the rim 270 of the wearable electronic device 101 and may include condenser lenses and/or transparent waveguides in the glass lenses 211 and 212. For example, the transparent waveguides may be at least partially located in parts of the glass lenses 211 and 212. According to an embodiment, light emitted from the display module 160 may be input to ends of the glass lenses 211 and 212 through the glass lenses 211 and 212, and the input light may be transferred to the user through the waveguides formed in the glass lenses 211 and 212. The waveguides may be formed of glass or polymer and may include nano patterns, for example, polygonal or curved grating structures formed on surfaces inside or outside. According to an embodiment, the input light may be transferred to the user by being propagated or reflected inside the waveguides.

According to an embodiment, the display module 160 may be implemented with transparent elements, and the user may recognize an actual space behind the display module 160 through the display module 160. The display module 160 may display virtual objects in at least partial areas of the transparent elements to show the user the virtual objects added to at least part of the actual space. The first glass lens 211 and/or the second glass lens 212 included in the display module 160 may include a plurality of panels to correspond to the user's eyes (e.g., the left eye and/or the right eye), respectively. According to an embodiment, when the display module 160 includes a transparent uLED, the waveguides inside the glass lenses may be omitted.

According to an embodiment, the wearable electronic device 101 may include a virtual reality (VR) device. When the wearable electronic device 101 is a VR device, the display module 160 may be located on the glass lenses 211 and 212.

According to an embodiment, the screens 221 and 222 may be located on at least parts of the glass lenses 211 and 212. The first screen 221 may be located on at least part of the first glass lens 211. The second screen 222 may be located on at least part of the second glass lens 212. The screens 221 and 222 may provide an AR screen to the user.

In an embodiment, the temples 231 and 232 may be disposed on opposite sides of the wearable electronic device 101. The temples 231 and 232 may be located beside the user's face when the user has the wearable electronic device 101 on. The first temple 231 may be adjacent to the right side of the user's face when the user has the wearable electronic device 101 on. The second temple 232 may be adjacent to the left side of the user's face when the user has the wearable electronic device 101 on. The temples 231 and 232 may allow the wearable electronic device 101 to be fixed to the user's face when the user has the wearable electronic device 101 on. At least one component (e.g., the processor 120 of FIG. 1) may be disposed inside the temples 231 and 232.

In an embodiment, the temple tip 241 may be disposed at one of opposite ends of the temple 231, and the temple tip 242 may be disposed at one of opposite ends of the temple 232. The temple tips 241 and 242 may be located beside the user's ears when the user has the wearable electronic device 101 on. The first temple tip 241 may be located on the user's right ear when the user has the wearable electronic device 101 on. The second temple tip 242 may be located on the user's left ear when the user has the wearable electronic device 101 on. The temple tips 241 and 242 may allow the wearable electronic device 101 to be fixed next to the user's ears when the user has the wearable electronic device 101 on.

In an embodiment, the hinge 251 may be disposed at one end of the temple 231, and the hinge 252 may be disposed at one end of the temple 232. For example, the hinge 251 may be disposed on the opposite side to the end of the temple 231 at which the temple tip 241 is disposed, and the hinge 252 may be disposed on the opposite side to the end of the temple 232 at which the temple tip 242 is disposed. The hinges 251 and 252 may connect the temples 231 and 232 and the rim 270. The hinges 251 and 252 may fold or unfold the temples 231 and 232. When the temples 231 and 232 are folded, the temples 231 and 232 may be folded to face inner surfaces of the glass lenses 211 and 212. For example, when the first temple 231 is folded, the first temple 231 may be folded in the form illustrated in FIG. 2 and/or FIG. 3 so as to face toward the inner surfaces of the glass lenses 211 and 212. When the temples 231 and 232 are unfolded, the temples 231 and 232 may form a predetermined angle with the rim 270. For example, when the second temple 232 is unfolded, the second temple 232 may be unfolded in the form illustrated in FIG. 2 and/or FIG. 3 so as to form an angle similar to a right angle with the rim 270. When the temples 231 and 232 are unfolded, the user may wear the wearable electronic device 101 on the face.

In an embodiment, the temple 231 and the temple tip 241 may be collectively referred to as the first housing part 210, and the temple 232 and the temple tip 242 may be collectively referred to as the third housing part 230. In an embodiment, the wearable electronic device 101 may have a form in which the first housing part 210 and the third housing part 230 are integrally coupled.

In an embodiment, the hinges 251 and 252 may connect the temples 231 and 232 and the rim 270. For example, the first hinge 251 may connect the first housing part 210 and the second housing part 220, and the second hinge 252 may connect the third housing part 230 and the second housing part 220.

In an embodiment, the holes 261 and 262 may be formed in the hinges 251 and 252. The holes 261 and 262 may be formed through the hinges 251 and 252. The holes 261 and 262 may include the first hole 261 and the second hole 262. The first hole 261 may be formed through the first hinge 251. A second hole 262 may pass through the second hinge 252. In a state in which the hinges 251 and 252 connect the first housing part 210 and the third housing part 230 with the second housing part 220, the holes 261 and 262 may have the form of a hollow passage that may be substantially empty with no part inside. For example, and without limitation, the holes 261 and 262 may have the form of a cylinder or a polygonal prism.

In an embodiment, outside air may be introduced into the holes 261 and 262. The outside air may pass through the holes 261 and 262. As illustrated in FIG. 2, the holes 261 and 262 may be at least partially exposed outside the hinges 251 and 252. However, without being limited thereto, the holes 261 and 262 may be covered by air permeable members so as not to be visible from outside the hinges 251 and 252.

In an embodiment, when the outside air passes through the holes 261 and 262, heat generated from components inside the wearable electronic device 101 may be radiated to the outside. For example, heat generated from components (e.g., the processor 120 of FIG. 1) disposed inside the temples 231 and 232 may be radiated to the outside by the outside air passing through the holes 261 and 262. The holes 261 and 262 may serve as heat sinks that radiate heat generated from the inside of the wearable electronic device 101 to the outside to decrease a temperature rise of the wearable electronic device 101.

In an embodiment, the rim 270 may be disposed to surround the glass lenses 211 and 212. The rim 270 may maintain the form of the wearable electronic device 101 to allow the user to stably have the wearable electronic device 101 on. The rim 270 may support the glass lenses 211 and 212 such that the glass lenses 211 and 212 are located in front of the user's eyes when the user wears the wearable electronic device 101 on the face. The rim 270 may be collectively referred to as the second housing part 220.

In an embodiment, the hinges 251 and 252 may connect the first housing part 210 and the third housing part 230 with the second housing part 220. For example, the hinges 251 and 252 may connect the temple 231 included in the first housing part 210 and the temple 232 included in the third housing part 230 with the rim 270 included in the second housing 220. The first hinge 251 may electrically connect components included in the first housing part 210 with components included in the second housing part 220. The second hinge 252 may electrically connect components included in the third housing part 230 with components included in the second housing part 220. In an embodiment, the first hinge 251 may be a structure that couples a portion of the first housing part 210 and a portion of the second housing part 220, and the second hinge 252 may be a structure that couples a portion of the third housing part 230 and a portion of the second housing part 220. For example, portions of the hinges 251 and 252 that are closer to the temples 231 and 232 than the holes 261 and 262 may be included in the first housing part 210 or the third housing part 230. Portions of the hinges 251 and 252 that are closer to the rim 270 than the holes 261 and 262 may be included in the second housing part 220.

In an embodiment, the first housing part 210 and/or the third housing part 230 may include at least one operating button 280. The operating button 280 may be disposed on the temples 231 and/or 232. For example, as illustrated in FIG. 2 and/or FIG. 3, the operating button 280 may be disposed on one side surface of the first temple 231. The operating button 280 may allow the user to operate the wearable electronic device 101. For example, when the user presses the operating button 280, the wearable electronic device 10 may switch a mode so as to display the screens 221 and 222 on the glass lenses 211 and 212 or so as not to display the screens 221 and 222 on the glass lenses 211 and 212.

Figure 4:
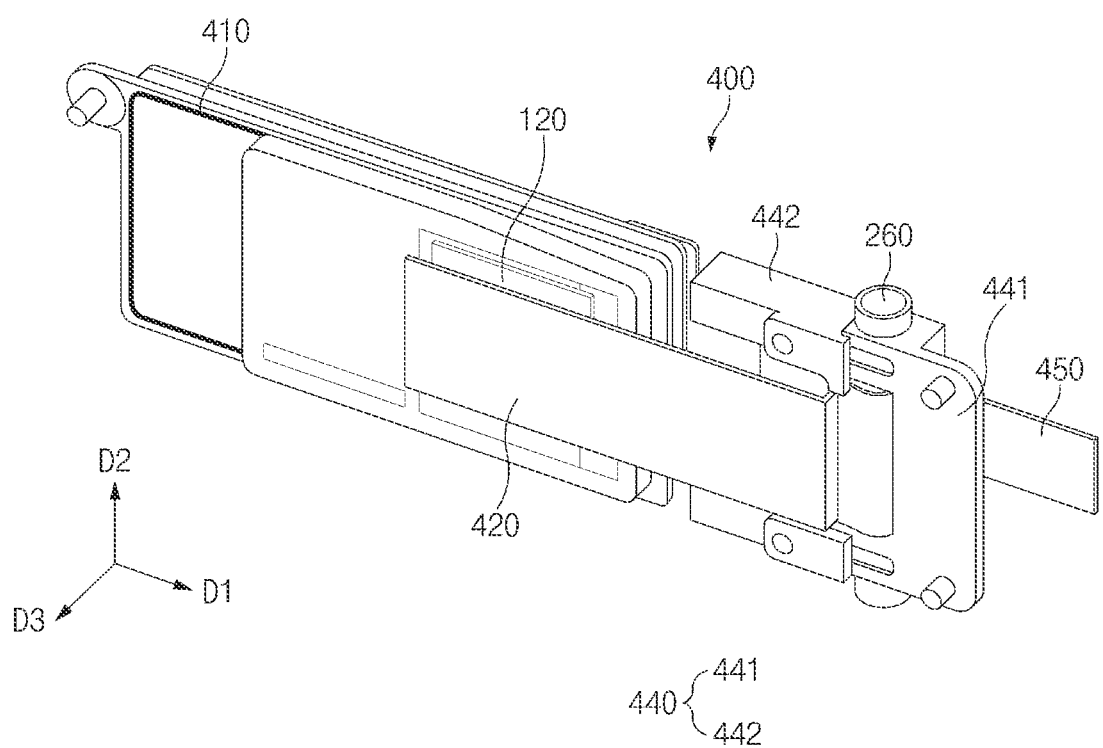
FIG. 4 is a perspective view illustrating an example first housing part and hinge of a wearable electronic device according to various embodiments.
Figure 5:
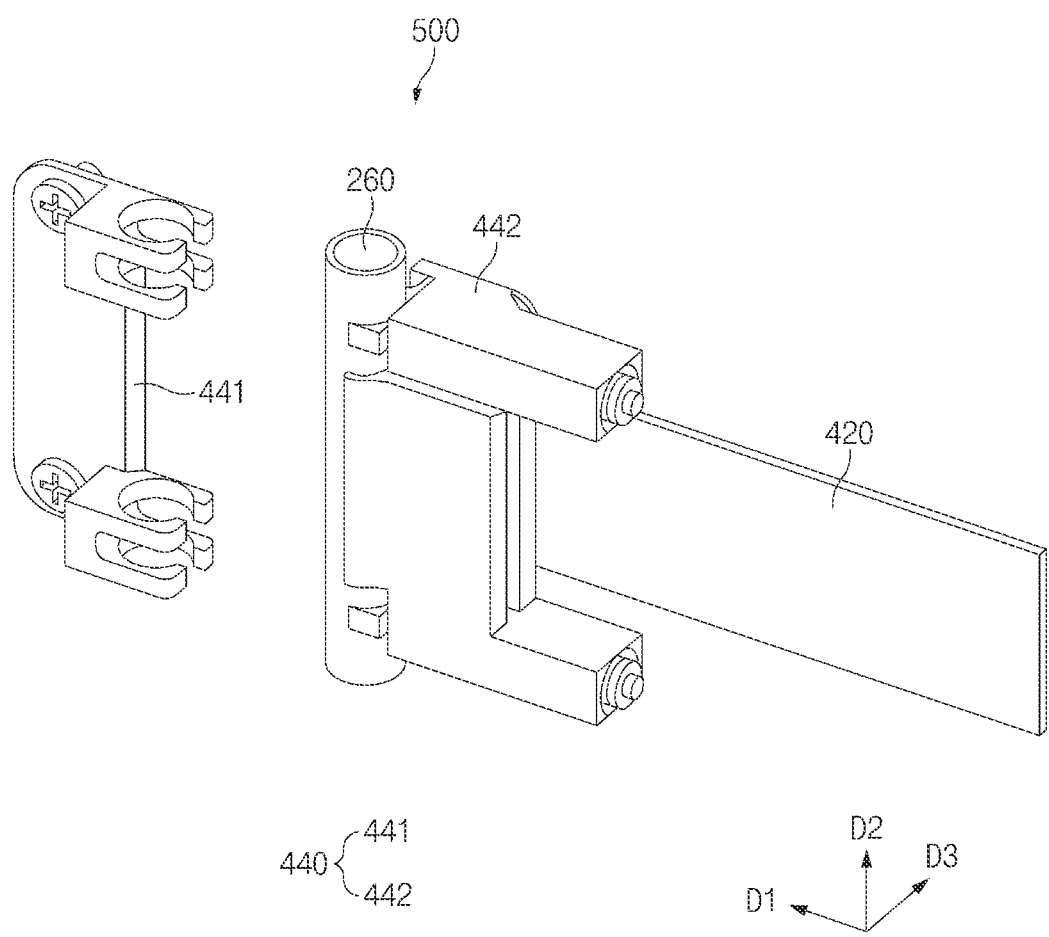
FIG. 5 is an exploded perspective view illustrating the hinge of the wearable electronic device according to various embodiments.
Figure 6:
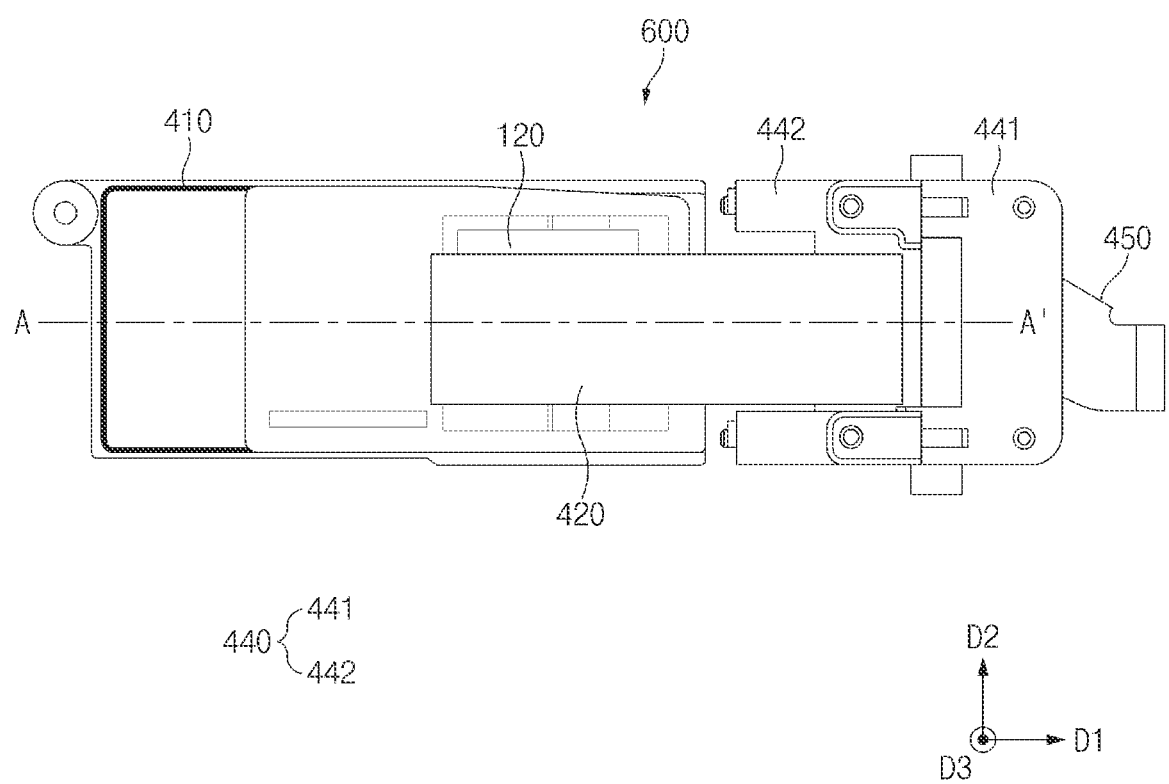
FIG. 6 is a side view illustrating the first housing part and the hinge of the wearable electronic device according to various embodiments.
Figure 7:
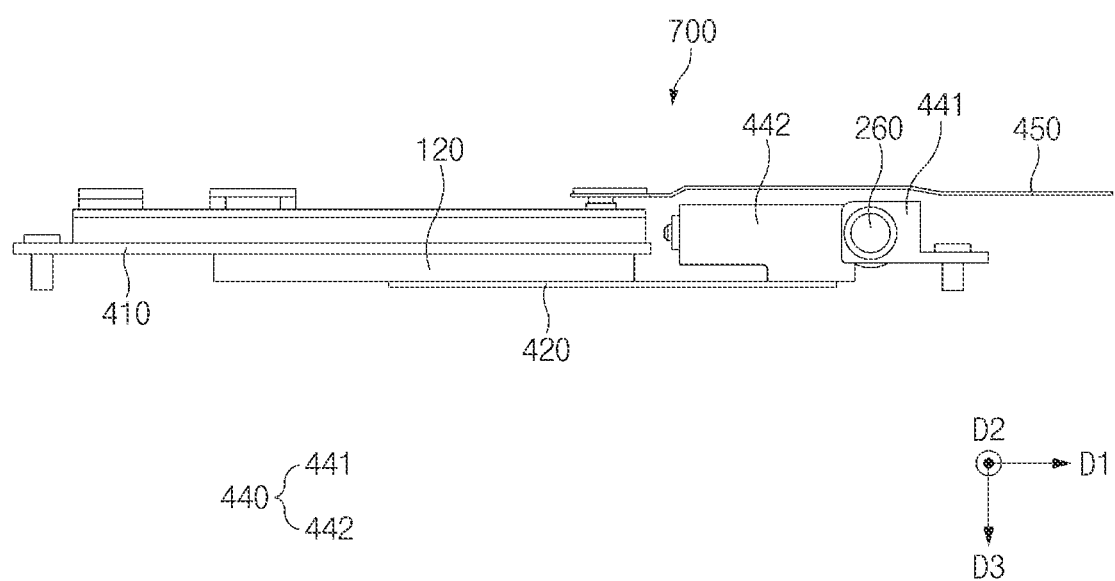
FIG. 7 is a front view illustrating the first housing part and the hinge of the wearable electronic device according to various embodiments.
Figure 8:
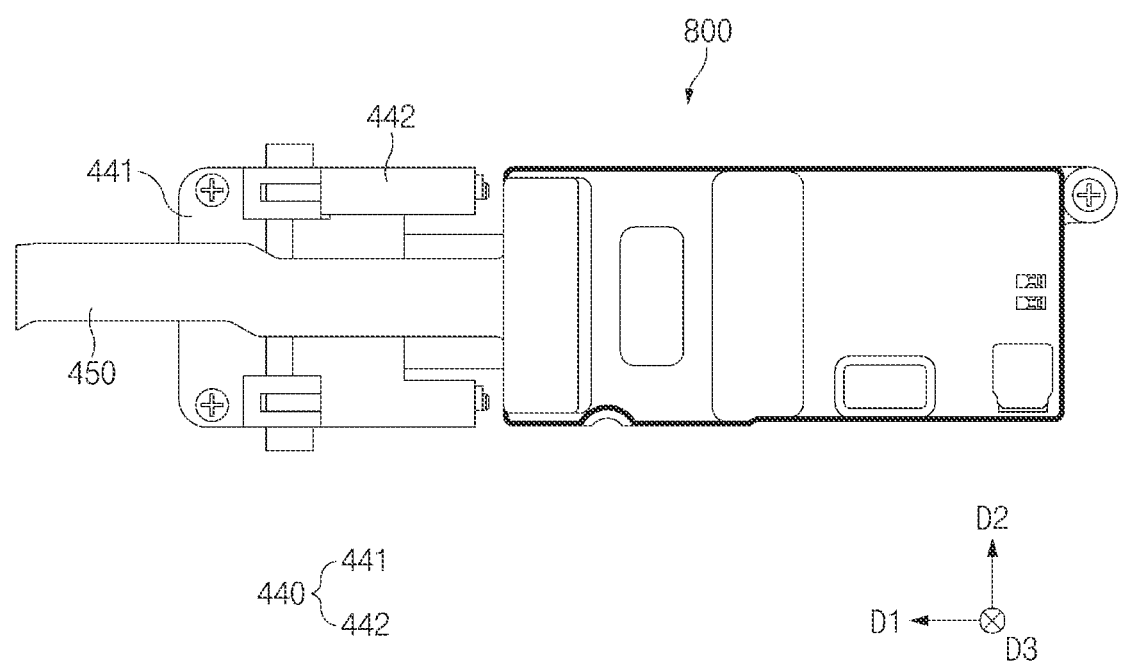
FIG. 8 is a side view illustrating the first housing part and the hinge of the wearable electronic device according to various embodiments.

FIG. 4 is a perspective view 400 illustrating a first housing part (e.g., the first housing part 210 of FIG. 2 and/or FIG. 3) and a hinge 440 (e.g., the first hinge 251 of FIG. 2 and/or FIG. 3) of a wearable electronic device (e.g., the wearable electronic device 101 of FIG. 2 and/or FIG. 3) according to various embodiments. FIG. 5 is an exploded perspective view 500 illustrating the hinge 440 of the wearable electronic device 101 according to various embodiments. FIG. 6 is a side view 600 illustrating the hinge 440 of the wearable electronic device 101 according to various embodiments. FIG. 7 is a front view 700 illustrating the hinge 440 of the wearable electronic device 101 according to various embodiments. FIG. 8 is a side view 800 illustrating the hinge 440 of the wearable electronic device 101 according to various embodiments.

The first housing part 210 according to an embodiment may include a PCB 410, a processor (e.g., including processing circuitry) 120, a conductive member (e.g., including a conductive material) 420, and/or a flexible printed circuit board (FPCB) 450. The hinge 440 may include a first hinge part 441 and a second hinge part 442. A hole 260 (e.g., the holes 261 and 262 of FIG. 2 and/or FIG. 3) may, for example, be formed in the second hinge part 442.

In an embodiment, the PCB 410 may be disposed inside the first housing part 210. The PCB 410 may include, for example, and without limitation, a circuit, an IC chip, and/or wiring required for operation of the wearable electronic device 101.

In an embodiment, the processor 120 may be included in the first housing part 210. The processor 120 may be mounted on the PCB 410. The processor 120 may include various processing circuitry and control overall operation of the wearable electronic device 101. Heat may be generated from the processor 120 when the processor 120 operates to control other components (e.g., the display module 160, the audio module 170, the sensor module 176, the power management module 188, and/or the communication module 190) of the wearable electronic device 101.

In an embodiment, the conductive member 420 may include a thermally conductive material and cover at least part of the processor 120. For example, the conductive member 420 may be located in a third direction D3 with respect to the processor 120 and may extend in a first direction D1. The conductive member 420 may be connected with the hinge 440. The conductive member 420 may connect the processor 120 and the hinge 440. The conductive member 420 may include a conductive material having a thermal conductivity greater than or equal to a specified first thermal conductivity. The conductive member 420 may transfer the heat generated from the processor 120 to the hinge 440.

In an embodiment, the hinge 440 may be disposed between the first housing part 210 and a second housing part (e.g., the second housing part 220 of FIG. 2 and/or FIG. 3). The hinge 440 may include a hinge structure. The hinge 440 may rotatably connect the first hinge part 210 and the second hinge part 220. For example, the hinge 440 may fold or unfold the temples 231 and 232. The hinge 440 may include the first hinge part 441 and the second hinge part 442.

In an embodiment, the first hinge part 441 may be connected with the first housing part 210. The first hinge part 441 may include a recess for receiving at least a portion of the second hinge part 442. The first hinge part 441 may rotate the second hinge part 442 received in the recess. The first hinge part 441 may include a structure of a receptacle.

In an embodiment, the second hinge part 442 may be connected with the second housing part 220. At least a portion of the second hinge part 442 may be received in the recess of the first hinge part 441. The second hinge part 442 may rotate the first housing part 210 and the second housing part 220 while rotating. The hole 260 may be formed in the second hinge part 442.

In an embodiment, the hole 260 may be formed in the hinge 440. The hole 260 may be formed in the second hinge part 442. For example, the hole 260 may be formed through the second hinge part 442 in a second direction D2. For example, the second direction D2 may be a direction substantially perpendicular to the first direction D1. The second direction D2 may be an upward direction (e.g., a direction toward a higher position than the head) when the user wears the wearable electronic device 101 on the face. In an embodiment, the hole 260 of the second hinge part 442 may be formed in an integrated form having no seams. The hole 260 may not penetrate the first hinge part 441 and may penetrate the second hinge part 442. One side of the second hinge part 442 in which the hole 260 is formed may be entirely inserted into the first hinge part 441. The hole 260 may not penetrate the first hinge part 441 itself and may penetrate only the second hinge part 442.

In an embodiment, the hinge 440 may have a thermal conductivity greater than or equal to the first thermal conductivity. The hinge 440 may receive, through the conductive member 420, heat generated from an internal component (e.g., the processor 120 of FIG. 1) of the electronic device 101.

In an embodiment, the hinge 440 may have a stiffness greater than or equal to a specified first stiffness. For example, the first stiffness may be greater than or equal to a minimum stiffness required for the hinge 440 to maintain a folded and/or unfolded state of the first housing part 210 and the second housing part 220. The first stiffness may be greater than or equal to a minimum stiffness required for the hinge 440 to repeatedly perform a folding operation and/or an unfolding operation of the first housing part 210 and the second housing part 220 a specified number of times. In an embodiment, the first stiffness may be greater than or equal to a minimum stiffness for implementing the structure in which the hole 260 is formed in the hinge 440. For example, the conductive member 420 and/or the hinge 440 may have a thermal conductivity greater than or equal to the first thermal conductivity and may have a stiffness greater than or equal to the first stiffness. In an embodiment, the conductive member 420 and/or the hinge 440 may contain the same or similar material(s).

In an embodiment, outside air may flow in the second direction D2 through the hole 260 formed in the hinge 440. When the temperature of the hinge 440 is raised by heat transferred to the hinge 440, the amount and/or speed of air flowing in the second direction D2 through the hole 260 formed in the hinge 440 may be increased. The heat transferred to the hinge 440 may be radiated to the outside by the air flowing in the second direction D2 through the hole 260 formed in the hinge 440. In an embodiment, the hole 260 may form a heat radiation structure that radiates heat generated from an internal component (e.g., the processor 120) of the electronic device 101 to the outside. The hole 260 may function as a heat sink that radiates heat generated from the inside of the electronic device 101 to decrease a temperature rise of the electronic device 101.

In an embodiment, the FPCB 450 may be disposed across the first housing part 210 and the second housing part 220. For example, the FPCB 450 may extend from one area inside the first housing part 210 in the first direction D1 and may be connected to one area inside the second housing part 220. The FPCB 450 may be disposed on one surface of the hinge 440. For example, the FPCB 450 may be disposed on one surface of the second hinge part 442. The FPCB 450 may be disposed on a surface of the hinge 440 that is opposite to a surface of the hinge 440 on which the conductive member 420 is disposed. For example, when the conductive member 420 is disposed on a surface of the hinge 440 that faces the third direction D3, the FPCB 450 may be disposed on a surface of the hinge 440 that faces a direction −D3 opposite to the third direction. The third direction D3 may be a direction in which the conductive member 420 covers the processor 120.

In an embodiment, the FPCB 450 may be disposed to bypass the hinge 260. The FPCB 450 may electrically connect a component disposed in the first housing part 210 and a component disposed in the second housing part 220. For example, one end of the FPCB 450 may be electrically connected with the PCB 410 disposed in the first housing part 210. In another example, an opposite end of the FPCB 450 may be electrically connected with a display (e.g., the display module 160 of FIG. 1) that is disposed in the second housing part 220. The FPCB 450 may electrically connect the processor 120 and the display module 160.

In an embodiment, air outside the wearable electronic device 101 may pass through an inner wall of the hole 260, which is formed in the hinge 440, in the second direction D2 to radiate heat generated from the processor 120 to the outside. The inner wall of the hole 260 may have a prismatic form facing the second direction D2. For example, the inner wall of the hole 260 may have the form of a cylinder and/or a polygonal prism. The outside air passing through the hole 260 so as to face the second direction D2 may make contact with the inner wall of the hole 260. The outside air may flow upward from below the hole 260 by passing through the hole 260 while making contact with the inner wall of the hole 260. The outside air may lower the temperature of the hinge 440 by radiating, to the outside, heat that is generated from the processor 120 and is transferred to the hinge 440 through the conductive member 420.

In an embodiment, the inner wall of the hole 260 formed in the hinge 440 may have a surface area larger than or equal to a specified first area. The first area may be a minimum surface area for radiating, to the outside, heat that is generated from the processor 120 and is transferred to the hinge 440 through the conductive member 420. As the surface area of the inner wall of the hole 260 formed in the hinge 440 is increased, the amount and/or speed of outside air flowing through the hole 260 may be increased. When the amount and/or speed of outside air flowing through the hole 260 is increased, the rate at which heat is radiated to the outside through the hole 260 may be increased. According to an embodiment, the inside of the hole 260 formed in the hinge 440 may include a structure for increasing a surface area making contact with outside air flowing through the hole 260. For example, and without limitation, a structure having a cross form, a mesh form, a polygonal form, or the like, may be formed inside the hole 260.

In an embodiment, the hinge 440 may be integrally formed with the conductive member 420. When the hinge 440 is integrally formed with the conductive member 420, heat generated from the processor 120 may be easily transferred to the hinge 440 through the conductive member 420.

In an embodiment, the hinge 440 may be formed of aluminum. Aluminum may have excellent characteristics of receiving heat and excellent characteristics of radiating heat to the outside. When the hinge 440 is formed of aluminum, the hinge 440 may rapidly receive heat from the conductive member 420. The hinge 440 formed of aluminum may rapidly radiate the transferred heat to the outside through the hole 260.

In an embodiment, a non-conductive member including a non-conductive material may surround the hinge 440. For example, the non-conductive member may be disposed to surround the hole 260 of the second hinge part 442 in which the hole 260 is formed. The non-conductive member may support the hinge 440. The non-conductive member may fix the position of the hole 260. The non-conductive member may fix the direction of the hole 260 such that the hole 260 faces the second direction D2. In an embodiment, the non-conductive member disposed to surround the hinge 440 may block transfer of heat from the hinge 440 to the user.

In an embodiment, an air permeable member including an air permeable material (not shown) may be disposed in the second direction D2 with respect to the hole 260 formed in the hinge 440. The air permeable member may block part of visible light. The air permeable member may be formed of a porous material through which air flows. For example, and without limitation, the air permeable member may be a polymer having a mesh structure. When viewed in the second direction D2, the air permeable member may cover the hole 260 formed in the hinge 440. When the air permeable member covers the hole 260, a phenomenon in which the inside of the hole 260 is directly visible in the second direction D2 may be reduced. In an embodiment, when the air permeable member covers the hole 260, heat radiation performance may be kept by maintaining a flow of outside air through the hole 260. In an embodiment, when the air permeable member covers the hole 260, infiltration of dust into the hole 260 may be decreased.

Figure 9:
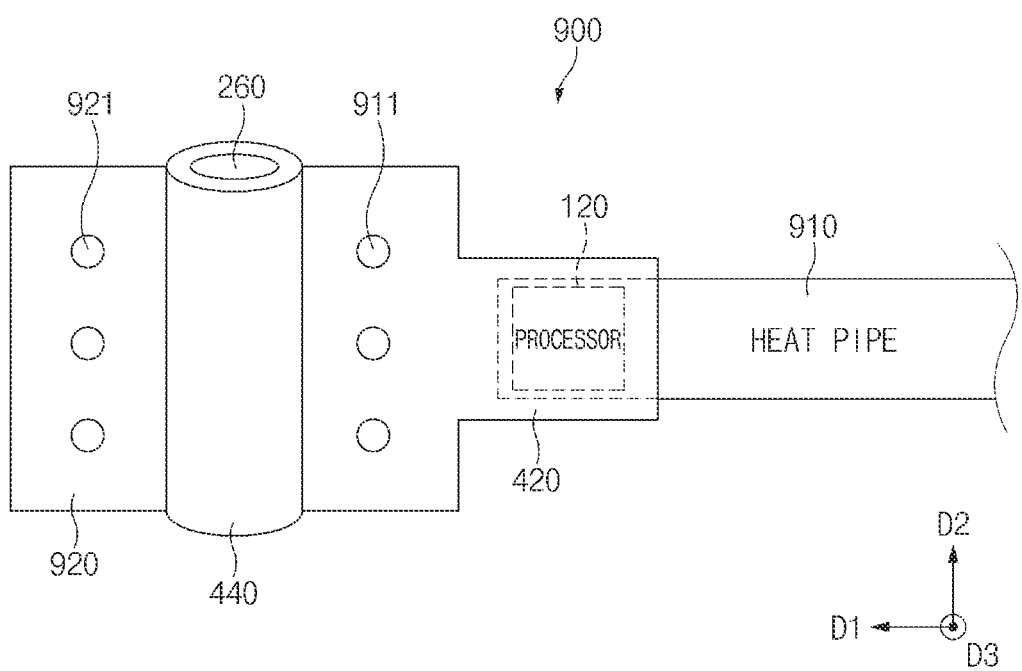
FIG. 9 is a side view illustrating a first housing part and a hinge of a wearable electronic device according to various embodiments.

FIG. 9 is a side view 900 illustrating a first housing part (e.g., the first housing part 210 of FIG. 2 and/or FIG. 3) and a hinge 440 of a wearable electronic device (e.g., the wearable electronic device 101 of FIG. 2 and/or FIG. 3) according to various embodiments.

In an embodiment, a conductive member 420, when viewed in the third direction D3, may cover a processor 120. For example, the conductive member 420 may be located over the processor 120 in the third direction D3. In another example, a heat pipe 910 may be located between the conductive member 420 and the processor 120. In this case, the heat pipe 910 may cover the processor 120 in the third direction D3, and the conductive member 420 may cover at least part of the heat pipe 910 in the third direction D3. The conductive member 420 may extend in the first direction D1 from the area covering the processor 120. One end of the conductive member 420 may be connected with the hinge 440.

In an embodiment, the conductive member 420 may be connected with one side of the hinge 440 using a first fixing part 911. The first fixing part 911 may include a mechanical fastener such as, for example, and without limitation, a screw, or the like. In an embodiment, the conductive member 420 may be connected with the one side of the hinge 440 using, for example, and without limitation, an adhesive, an adhesive tape, or the like.

In an embodiment, a hole 260 may be formed in the hinge 440 so as to face the second direction D2. Outside air may flow through the hole 260. In an embodiment, heat generated from the processor 120 may be transferred to the hinge 440 through the conductive member 420. The outside air may radiate the heat transferred to the hinge 440 to the outside while flowing through the hole 260, which is formed in the hinge 440, in the second direction D2. The outside air may lower the temperature of the hinge 440 while flowing through the hole 260, and thus a heat radiation structure through which the heat generated from the processor 120 is radiated may be formed. The hole 260 may function as a heat sink that radiates the heat transferred to the hinge 440 to the outside and decreases a temperature rise of the hinge 440.

In an embodiment, the heat pipe 910 may be connected to the conductive member 420. The heat pipe 910 may extend from one lateral end of the conductive member 420 in a direction away from the conductive member 420. The heat pipe 910 may be disposed in a direction −D1 opposite to the first direction. The heat pipe 910 may be contained inside the first housing part 210.

In an embodiment, the heat pipe 910 may be formed of a thermally conductive material including, for example, copper. The heat pipe 910 may have a space inside. The space inside the heat pipe 910 may be filled with vapor. When the temperature of the processor 120 is raised, the vapor inside the heat pipe 910 may be gasified while the heat generated from the processor 120 may be rapidly transferred through the heat pipe 910 in a direction away from the hinge 440 of the first housing part 210.

In an embodiment, an additional conductive member 920 may be disposed on an opposite side of the hinge 440 in the first direction D1. The additional conductive member 920 may be connected with a second housing part 220. The additional conductive member 9208-20 may be connected with a display (e.g., the display module 160 of FIG. 1). The additional conductive member 920 may transfer heat generated from the display to the hinge 440. The additional conductive member 920 may be connected with the opposite side of the hinge 440 using a second fixing part 921. The second fixing part 921 may include a mechanical fastener such as, for example, and without limitation, a screw, or the like.

Figure 10:
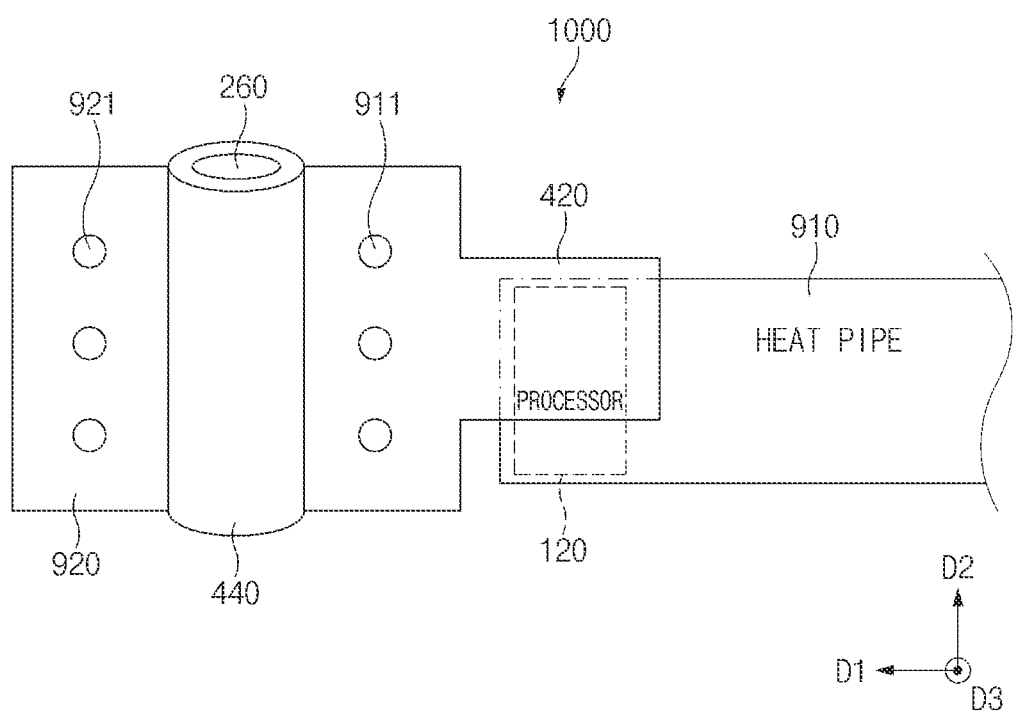
FIG. 10 is a side view illustrating a first housing part and a hinge of a wearable electronic device according to various embodiments.

FIG. 10 is a side view 1000 illustrating a hinge 440 of a wearable electronic device (e.g., the wearable electronic device 101 of FIG. 2 and/or FIG. 3) according to various embodiments.

In an embodiment, a conductive member 420 may cover only part of a processor 120. When viewed in the third direction D3 substantially perpendicular to the first direction D1 and the second direction D2, the conductive member 420 may be biased in the second direction D2 with respect to the processor 120. The conductive member 420 may be disposed over the processor 120. Depending on a structure and/or form of the wearable electronic device 101, the conductive member 420 may be disposed to pass over the processor 120.

In an embodiment, the conductive member 420 may be disposed to cover only part of the processor 120 when viewed in the third direction D3. For example, the conductive member 420 may not cover the entire surface of the processor 120 when the width of a first housing part 210 does not accurately correspond to the width of the hinge 440 in the first direction D1, or the conductive member 420 and the processor 120 have different sizes. Even when the conductive member 420 covers only part of the processor 120, the conductive member 420 may be disposed to transfer heat generated from the processor 120. Air, the temperature of which is raised by the heat generated from the processor 120, may be propagated more in the second direction D2 that is a direction toward a higher position than the processor 120. The conductive member 420 disposed over the processor 120 may transfer the heat flowing upward from the processor 120 in the first direction D1 in which the hinge 440 is located. According to an embodiment, at least part of the conductive member 420 may be located over the processor 120 in the third direction D3. For example, a heat pipe 910 may be located between the conductive member 420 and the processor 120.

Figure 11:
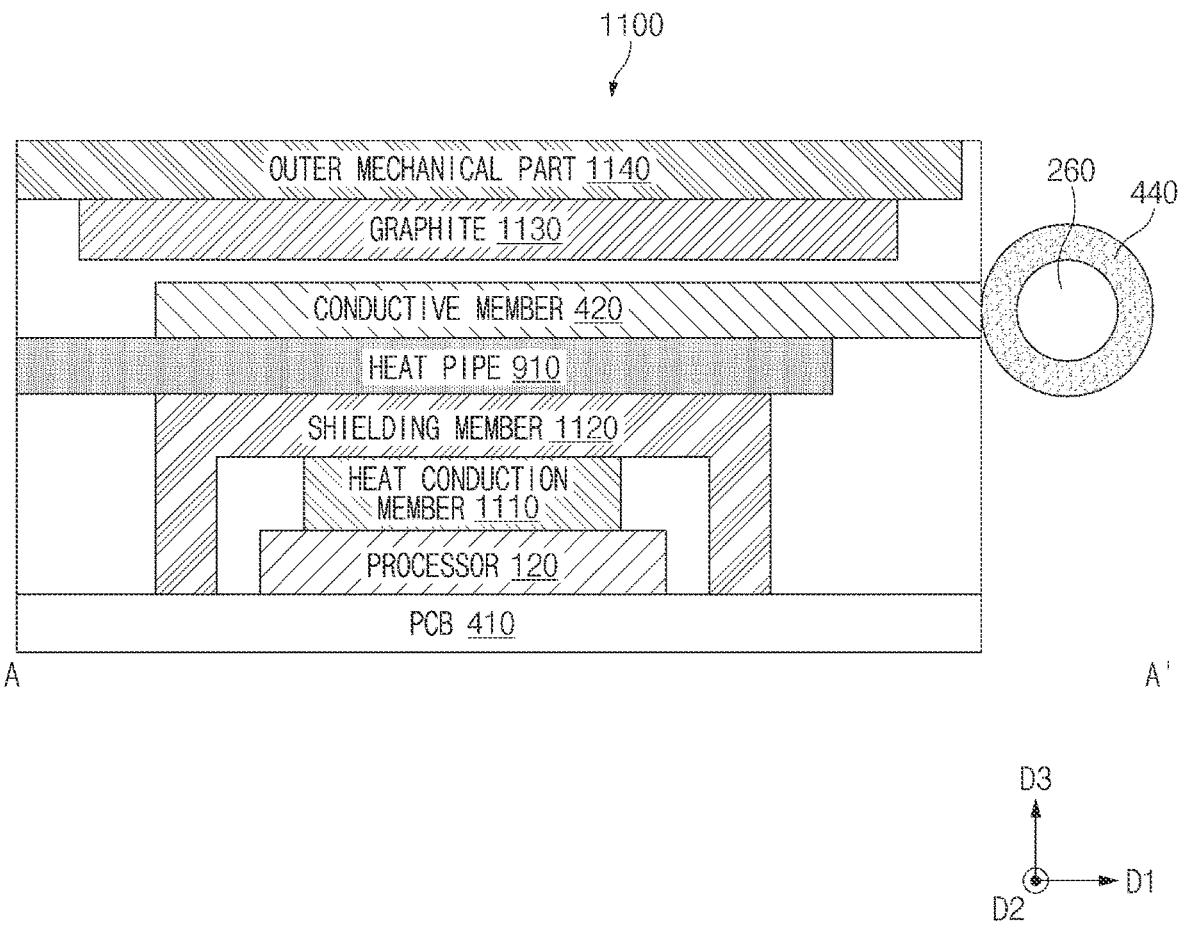
FIG. 11 is a cross-sectional view of a wearable electronic device according to various embodiments.

FIG. 11 is a cross-sectional view 1100 of a wearable electronic device (e.g., the wearable electronic device 101 of FIG. 2 and/or FIG. 3) according to various embodiments. For example, FIG. 11 is a side sectional view 1100 of the wearable electronic device 101 taken along line A-A' in FIG. 6 as viewed in the second direction D2.

In an embodiment, the wearable electronic device 101 may include a processor (e.g., including processing circuitry) 120, a hinge 440, a hole 260, a printed circuit board (PCB) 410, a conductive member (e.g., including a thermally conductive material) 420, a heat pipe 910, a heat conduction member (e.g., including a thermally conductive material) 1110, a shielding member (e.g., including a shielding material) 1120, graphite 1130, and an outer structure 1140.

In an embodiment, the processor 120 may be disposed on the PCB 410. The processor 120 may be mounted on one surface of the PCB 410 that faces the third direction D3.

According to various embodiments, the heat conduction member 1110 may include a thermally conductive material and be disposed between the processor 120 and the shielding member 1120 and may transfer heat generated from the processor 120 to the shielding member 1120. For example, the heat conduction member 1110 may be disposed to cover at least part of a surface that faces the third direction D3 among surfaces of the processor 120. The heat conduction member 1110 may have a thermal conductivity greater than or equal to a specified second thermal conductivity. The second thermal conductivity may be a thermal conductivity by which the heat conduction member 1110 transfers the heat generated from the processor 120 to a surface facing the third direction D3 at a specified rate or more. The heat conduction member 1110 may, for example, and without limitation, include a thermal interface material (TIM). For example, the heat conduction member 1110 may be formed of a carbon fiber thermal interface material (carbon fiber TIM) that is able to transfer the heat generated from the processor 120. However, the heat conduction member 1110 is not limited to the carbon fiber TIM and may include various heat radiation materials or members for transferring the heat generated from the processor 120 to the shielding member 1120. For example, the heat conduction member 1110 may include, for example, and without limitation, a thermal interface material (TIM), a heat pipe, a heat radiation sheet, heat radiation paint, or the like. Here, the material of the heat radiation sheet or the heat radiation paint may include, for example, a high thermal conductivity material such as graphite, a carbon nano tube, a natural recycled material, or silicon. In another example, the carbon fiber TIM may include at least one of a liquid phase thermal interface material (liquid phase TIM) and/or a solid phase thermal interface material (solid phase TIM).

In an embodiment, the shielding member 1120 may include a shielding material and surround at least part of the heat conduction member 1110 that covers at least part of the processor 120. For example, the shielding member 1120 may entirely surround the heat conduction member 1110 and/or the processor 120 in the first direction D1, the second direction D2, and/or the third direction D3. The shielding member 1120 may, for example, include a shield can.

In an embodiment, the heat pipe 910 may be disposed in the third direction D3 with respect to the shielding member 1120. The heat pipe 910 may extend in the direction −D1 opposite to the first direction.

In an embodiment, the conductive member 420 may be disposed over the shielding member 1120 (e.g., in the third direction D3). The conductive member 420 may extend in the first direction D1. The conductive member 420 may make contact with the hinge 440. The conductive member 420 may transfer the heat generated from the processor 120 to the hinge 440.

In an embodiment, the graphite 1130 may be disposed over the conductive member 420. The graphite 1130 may be disposed in the third direction D3 with respect to the conductive member 420.

In an embodiment, the outer mechanical part 1140 (e.g., the first housing part 210 of FIG. 2 and/or FIG. 3) may be disposed on the graphite 1130 (e.g., in the third direction D3).

In an embodiment, the hinge 440 may make contact with the conductive member 420. The hinge 440 may receive, from the conductive member 420, the heat generated from the processor 120. The hole 260 may be formed in the hinge 440 in the second direction D2. The hole 260 may be exposed outside the outer mechanical part 1140. Outside air may flow through the hole 260 in the second direction D2.

In an embodiment, the heat generated from the processor 120 may be transferred to the conductive member 420 in the third direction D3. The heat transferred to the conductive member 420 may be transferred to the hinge 440 located in the first direction D1 with respect to the conductive member 420. The heat transferred to the hinge 440 may be radiated to the outside through the hole 260 formed in the hinge 440 in the second direction D2. The hole 260 may serve as a heat sink that decreases a temperature rise of the hinge 440.

According to an embodiment, the wearable electronic device 101 may further include a support member (not illustrated) (e.g., a bracket) for fixing or supporting the PCB 410, the shielding member 1120, the heat pipe 910, and/or the conductive member 420. For example, the PCB 410, the shielding member 1120, the heat pipe 910, and/or the conductive member 420 may be disposed on one surface of the support member (not illustrated).

Although not illustrated, according to an embodiment, the conductive member 420 located between the processor 120 and the hinge 440 in FIG. 11 may be omitted. For example, the heat generated from the processor 120 may be radiated to the outside while being transferred to one end of a first housing part (e.g., the first housing part 210 of FIG. 2 and/or FIG. 3) or the hinge 440 through the heat pipe 910.

Although not illustrated, according to an embodiment, the conductive member 420 and the heat pipe 910 located between the processor 120 and the hinge 440 may be omitted. For example, the heat generated from the processor 120 may be transferred to a partial area of the hinge 440, and the heat transferred to the hinge 440 may be radiated to the outside through the hole 260 of the hinge 440.

Figure 12:
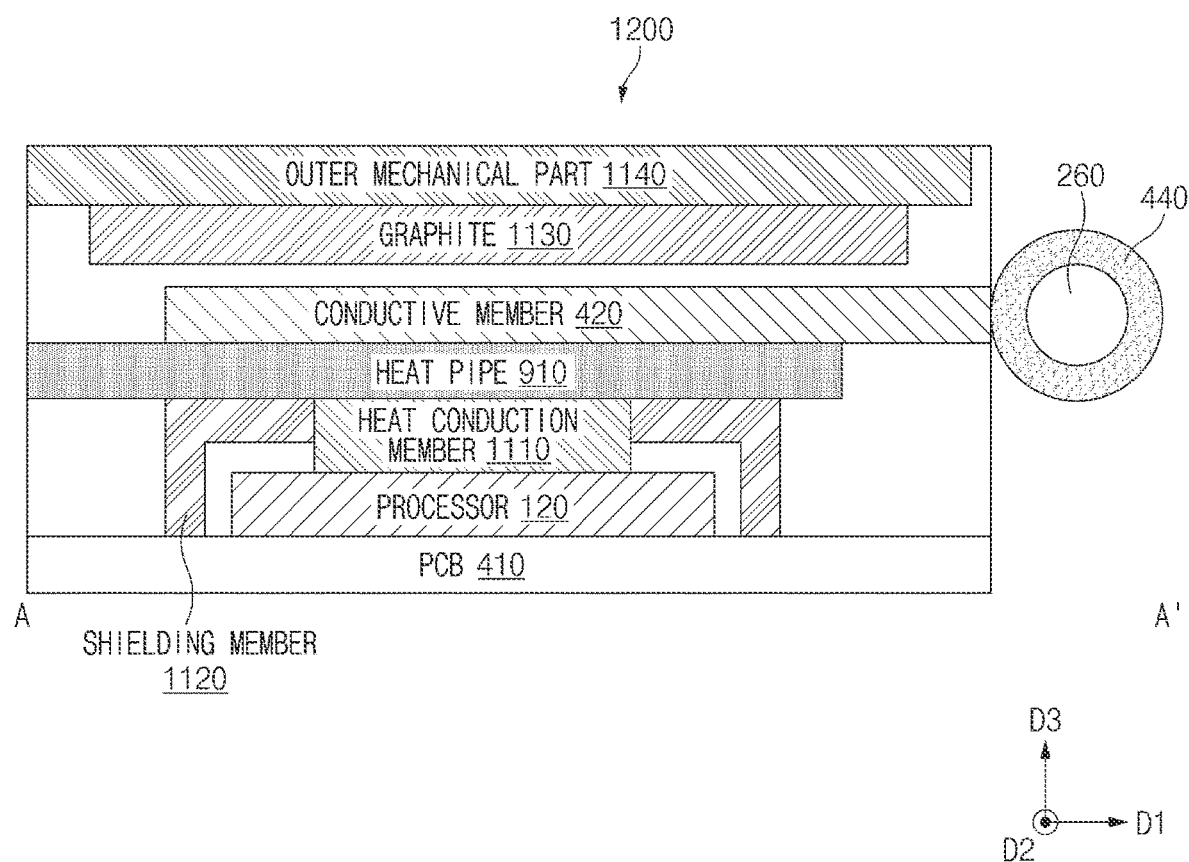
FIG. 12 is a cross-sectional view of a wearable electronic device according to various embodiments.

FIG. 12 is a cross-sectional view 1200 of a wearable electronic device (e.g., the electronic device 101 of FIG. 1) according to various embodiments.

In an embodiment, a shielding member 1120 may cover part of a processor 120. For example, the shielding member 1120 may cover part of the processor 120 in the third direction D3. The shielding member 1120 may allow at least part of the processor 120 to be open in the third direction D3.

In an embodiment, a heat conduction member 1110 may be disposed in an area where the processor 120 is open by the shielding member 1120 in the third direction D3. The heat conduction member 1110 may be a member that is able to shield and conduct heat. For example, the heat conduction member 1110 may include, for example, and without limitation, a nano form material such as a nano thermal interface material (nano TIM). The nano form material may have heat shielding characteristics and heat conduction characteristics. For example, the heat conduction member 1110 may be more excellent in thermal conductivity than the shielding member 1120.

In an embodiment, a heat pipe 910 may be disposed on the shielding member 1120 and the heat conduction member 1110. The heat pipe 910 may transfer heat transferred from the heat conduction member 1110 to a conductive member 420 and a first housing part (e.g., the first housing part 210 of FIG. 2 and/or FIG. 3).

Although not illustrated, according to an embodiment, the conductive member 420 located between the processor 120 and a hinge 440 may be omitted. For example, heat generated from the processor 120 may be radiated to the outside while being transferred to one end of the first housing part (e.g., the first housing part 210 of FIG. 2 and/or FIG. 3) through the heat conduction member 1110 and the heat pipe 910.

Although not illustrated, according to an embodiment, the conductive member 420 and the heat pipe 910 located between the processor 120 and the hinge 440 may be omitted. For example, the heat generated from the processor 120 may be transferred to a partial area of the hinge 440 through the heat conduction member 1110, and the heat transferred to the hinge 400 may be radiated to the outside through a hole 260 of the hinge 440.

Figure 13:
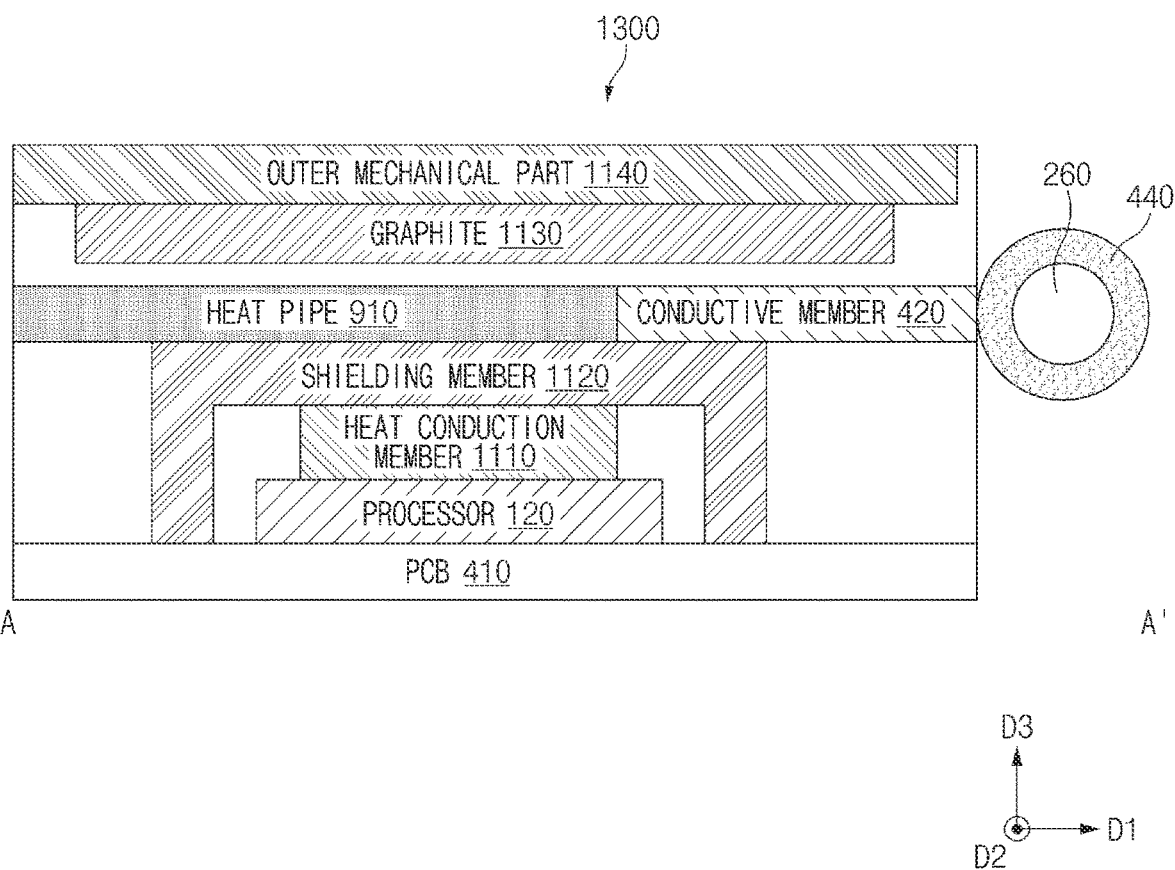
FIG. 13 is a cross-sectional view of a wearable electronic device according to various embodiments.

FIG. 13 is a cross-sectional view 1300 of a wearable electronic device (e.g., the electronic device 101 of FIG. 1) according to various embodiments.

In an embodiment, a heat pipe 910 and a conductive member 420 may be disposed in substantially the same layer. The heat pipe 910 and the conductive member 420 may be disposed on the same plane of a shielding member 1120.

In an embodiment, part of an area of the shielding member 1120 that faces the third direction D3 may be disposed to make contact with the conductive member 420. Part of the area of the shielding member 1120 that faces the third direction D3 may be disposed to make contact with the conductive member 420, and another part of the area may be disposed to make contact with the heat pipe 910.

In an embodiment, one side of the conductive member 420 that faces the first direction D1 may be disposed to make contact with a hinge 440. An opposite side of the conductive member 420 that faces the direction −D1 opposite to the first direction D1 may be disposed to make contact with the heat pipe 910.

Figure 14:
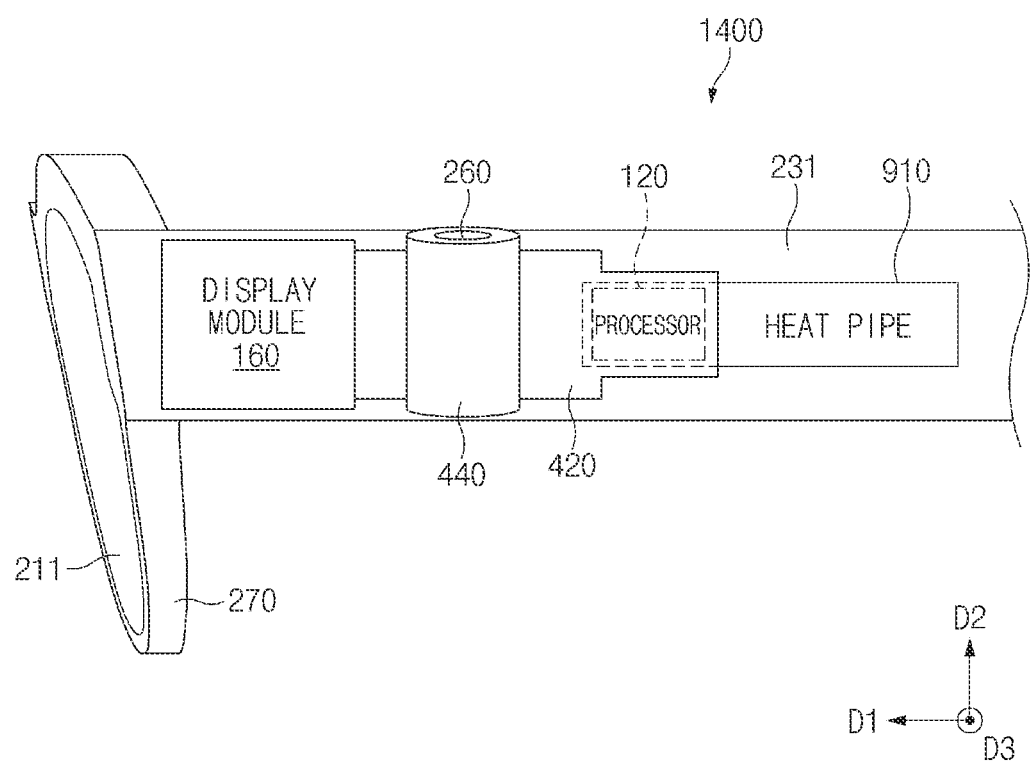
FIG. 14 is a side view illustrating a wearable electronic device according to various embodiments.

FIG. 14 is a side view 1400 illustrating a wearable electronic device (e.g., the wearable electronic device 101 of FIG. 2 and/or FIG. 3) according to various embodiments.

In an embodiment, a processor 120 may be contained inside a first temple 231 (e.g., the first housing part 210 of FIG. 2 and/or FIG. 3). The processor 120 may control overall operation of the wearable electronic device 101. As the processor 120 controls operation of the wearable electronic device 101, heat may be generated from the processor 120.

In an embodiment, a conductive member 420 may be contained inside the first temple 231. The conductive member 420 may cover at least part of the processor 120. The conductive member 420 may extend in the first direction D1 inside the first temple 231. The conductive member 420 may make contact with a hinge 440.

In an embodiment, the conductive member 420 may connect the processor 120 and the hinge 440. For example, the conductive member 420 may form a heat transfer path with the processor 120 to transfer the heat generated from the processor 120 to the hinge 440. The heat generated from the processor 120 may be transferred to the hinge 440 and may thereafter be radiated toward the second direction D2 through a hole 260 formed in the hinge 440.

In an embodiment, the hinge 440 may be disposed between the first temple 231 (e.g., the first housing part 210) and a rim 270 (e.g., the second housing part 220 of FIG. 2 and/or FIG. 3). For example, the hinge 440 may connect the first temple 231 and the rim 270. The hinge 440 may connect the first temple 231 to the rim 270 such that the first temple 230 is rotatable. The hinge 440 may allow the first temple 231 to be unfolded from the rim 270 or folded toward the rim 270.

In an embodiment, the hinge 440 may include the hole 260 facing the second direction D2.

In an embodiment, a heat pipe 910 may be disposed to cover a surface of the processor 120 that faces the third direction D3. The heat pipe 910 may extend in the direction −D1 opposite to the first direction inside the first temple 231. For example, the heat pipe 910 may be located between the processor 120 and the conductive member 420.

In an embodiment, a display module 160 may be disposed in the rim 270 (e.g., the second housing part 220). The display module 160 may include a display area (e.g., the screens 221 and 222 of FIG. 2 and/or FIG. 3) on a first glass lens 211 and may display a virtual object through the display area.

In an embodiment, so as to be connected with the display module 160 located in the rim 270, the conductive member 420 may extend from the first housing part 210 in the first direction D1, may pass through or surround the hinge 440, and may extend in the first direction D1 to connect to the second housing part 220. The conductive member 420 may transfer heat generated from the display module 160 to the hinge 440. The heat generated from the display module 160 may be transferred to the hinge 440 and may thereafter be radiated toward the second direction D2 through the hole 260 of the hinge 440. The hole 260 may serve as a heat sink that decreases a temperature rise of the hinge 440.

Figure 15:
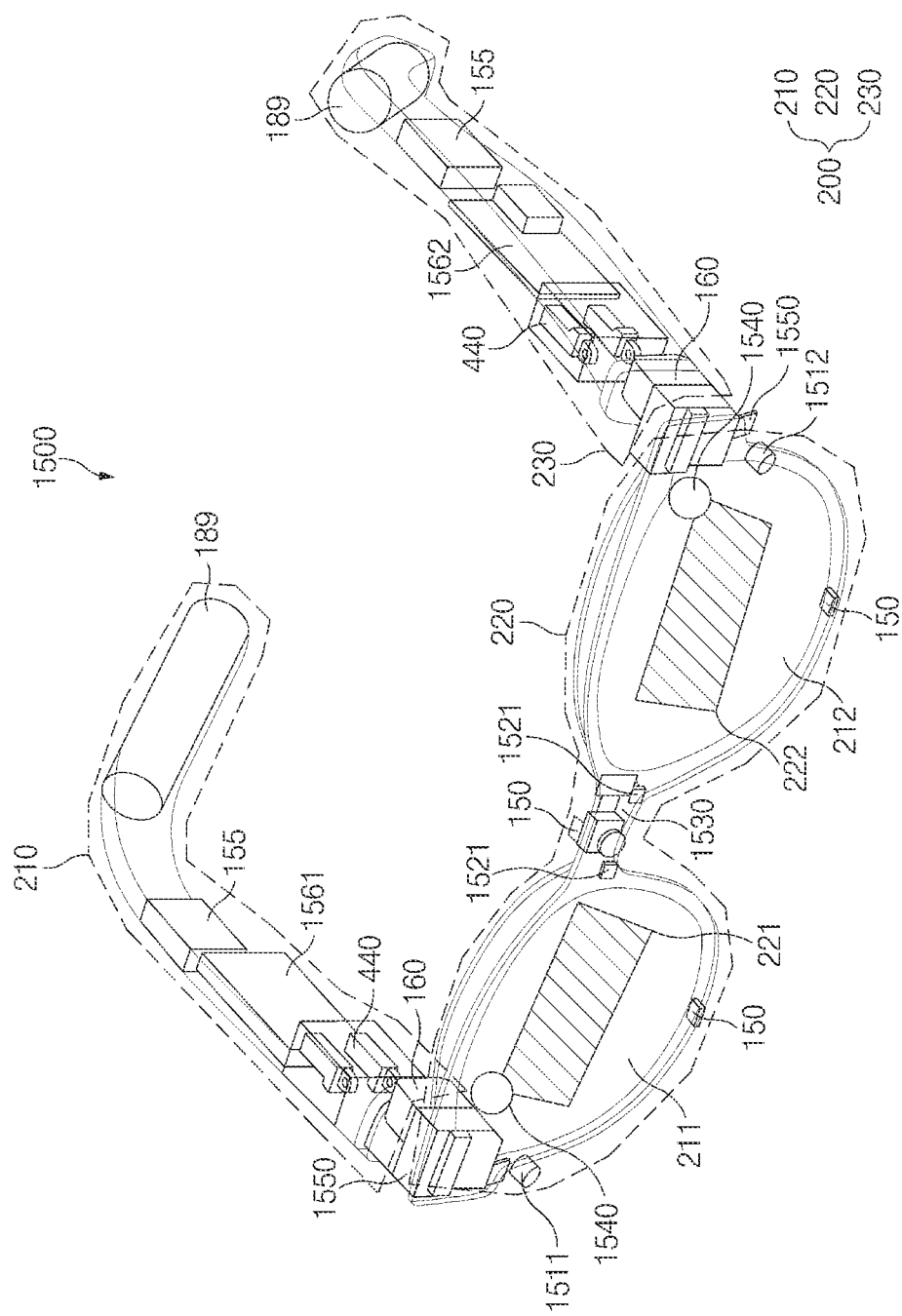
FIG. 15 is a perspective view illustrating a wearable electronic device according to various embodiments.

FIG. 15 is a perspective view 1500 illustrating a wearable electronic device (e.g., the electronic device 101 of FIG. 1) according to various embodiments. The wearable electronic device 101 may include displays 160, glass lenses 211 and 212, screens 221 and 212, first cameras 1511 and 1512, second cameras 1521, a third camera 1530, input optical members 1540, light emitting parts 1550, and PCBs 1561 and 1562. In addition, the wearable electronic device 101 may include input devices 150 such as microphones, sound output devices 155 such as speakers, batteries 189, and hinges 440.

In an embodiment, the displays 160 may include, for example, and without limitation, a liquid crystal display (LCD), a digital mirror device (DMD), a liquid crystal on silicon (LCoS) display, an organic light emitting diode (OLED) display, a micro light emitting diode (micro LED) display, or the like. Although not illustrated, in a case where the displays 160 are implemented with one of a liquid crystal display, a digital mirror device, or a liquid crystal on silicon display, the electronic device 101 may include light sources that emit light toward the screens 221 and 222. In an embodiment, in a case where the displays 160 are able to generate light by themselves, for example, in a case where the displays 160 are implemented with one of an organic light emitting diode display or a micro LED display, the electronic device 101 may provide a virtual image having good quality to a user even though not including a separate light source. In an embodiment, in the case where the displays 160 are implemented with an organic light emitting diode display or a micro LED display, light sources may be unnecessary, and thus the weight of the electronic device 101 may be reduced. The user may use the electronic device 101 in a state in which the electronic device 101 is worn on the face. The glass lenses 211 and 212 may be formed, for example, and without limitation, of a glass plate, a plastic plate, a polymer, or the like. The glass lenses 211 and 212 may be formed to be transparent or translucent. The glass lenses 211 and 212 may include the first glass lens 211 and the second glass lens 212. The first glass lens 211 may be disposed to face the user's right eye, and the second glass lens 212 may be disposed to face the user's left eye. When the displays 160 are transparent, the first glass lens 211 and the second glass lens 212 may be disposed in positions facing the user's eyes.

In an embodiment, the screens 221 and 222 may provide, to the user, screens that the displays 160 display. The screens 221 and 222 may be formed inside the glass lenses 211 and 212. The screens 221 and 222 may include the first screen 221 and the second screen 222. The first screen 221 may be formed inside the first glass lens 211, and the second screen 222 may be formed inside the second glass lens 212.

In an embodiment, the first cameras 1511 and 1512 may recognize the user's body and/or a space. The first cameras 1511 and 1512 may track the user's head. The first cameras 1511 and 1512 may detect and track the user's hands. The first cameras 1511 and 1512 may recognize a space. The first cameras 1511 and 1512 may, for example, be 3DoF cameras or 6DoF cameras. The first cameras 1511 and 1512 may be global shutter (GS) cameras. For tracking the body and/or recognizing the space, the first cameras 1511 and 1512 may have a stereo structure. The first cameras 1511 and 1512 may require two cameras having substantially the same standard and/or performance. To detect and track rapid hand motions and fine finger movements, the first cameras 1511 and 1512 may be GS cameras, such as rolling shutter (RS) cameras, which have no screen dragging. The first cameras 1511 and 1512 may perform space recognition for 6DoF and may perform a SLAM function through depth photographing. The first cameras 1511 and 1512 may perform a user gesture recognition function.

In an embodiment, the second cameras 1521 may detect and track pupils. The second cameras 1521 may be cameras for eye tracking. The second cameras 1521 may allow the center of a virtual image projected on the electronic device 101 to be located depending on a direction in which the pupils of a wearer of the electronic device 101 gaze. The second cameras 1521 may be GS cameras. In the case where the second cameras 1521 are GS cameras, the second cameras 1521 may detect pupils and may track rapid pupil movements without screen dragging. The second cameras 1521 may be installed for the left eye and the right eye, respectively. The second cameras 1521 may have a stereo structure. The second cameras 1521 may be implemented with two cameras having substantially the same performance and standard.

In an embodiment, the third camera 1530 may take an image of an external object (e.g., a person, a thing, and/or a background). The third camera 1530 may be a high-resolution camera such as high resolution (HR) or photo video (PV). The third camera 1530 may have a function for obtaining a high-quality image, such as an auto focus (AF) function and/or an optical image stabilizer (OIS) function. The third camera 1530 may be a camera having high color-related performance. The third camera 1530 may be a GS cameras or an RS camera.

In an embodiment, the input optical members 1540 may guide light to waveguides. Detailed description of operation of the input optical members 1540 will be given in greater detail below with reference to FIG. 16.

In an embodiment, the light emitting parts 1550 may be disposed inside a second housing part (e.g., the second housing part 220 of FIG. 2). The light emitting parts 1550 may be disposed to face toward a front side of the second housing part 220. The light emitting parts 1550 may be disposed adjacent to the hinges 440. However, without being limited thereto, the light emitting parts 1550 may be disposed adjacent to the center of the second housing part 220. The light emitting parts 1550 may supplement surrounding brightness when the first cameras 1511 and 1512 take images. The light emitting parts 1550 may supplement surrounding brightness when a subject to be photographed is not easy to detect due to a dark environment or mixing and reflected light of multiple light sources. The light emitting parts 1550 may be used as auxiliary means for facilitating detection of eye gaze when the second cameras 1521 take images of the pupils. The light emitting parts 1550 may be IR LEDs that emit light in the infrared wavelength band.

In an embodiment, the PCBs 1561 and 1562 may be disposed inside a first housing part (e.g., the first housing part 210 of FIG. 2) or a third housing part (e.g., the third housing part 230 of FIG. 2). The PCBs 1561 and 1562 may be disposed adjacent to temples (e.g., the temples 231 and 232 of FIG. 2). The PCBs 1561 and 1562 may be electrically connected with an FPCB (e.g., the FPCB 450 of FIG. 4). The PCBs 1561 and 1562 may transfer electrical signals to modules (e.g., the first cameras 1511 and 1512, the second cameras 1521, the third camera 1530, the displays 160, the input devices 150, and the sound output devices 155) inside the electronic device 101 through the FPCB 450. The PCBs 1561 and 1562 may include the first PCB 1561 and the second PCB 1562. The first PCB 1561 and the second PCB 1562 may be electrically connected with each other. For example, an interposer may be disposed between the first PCB 1561 and the second PCB 1562. The first PCB 1561 and the second PCB 1562 may exchange electrical signals with each other.

Figure 16:
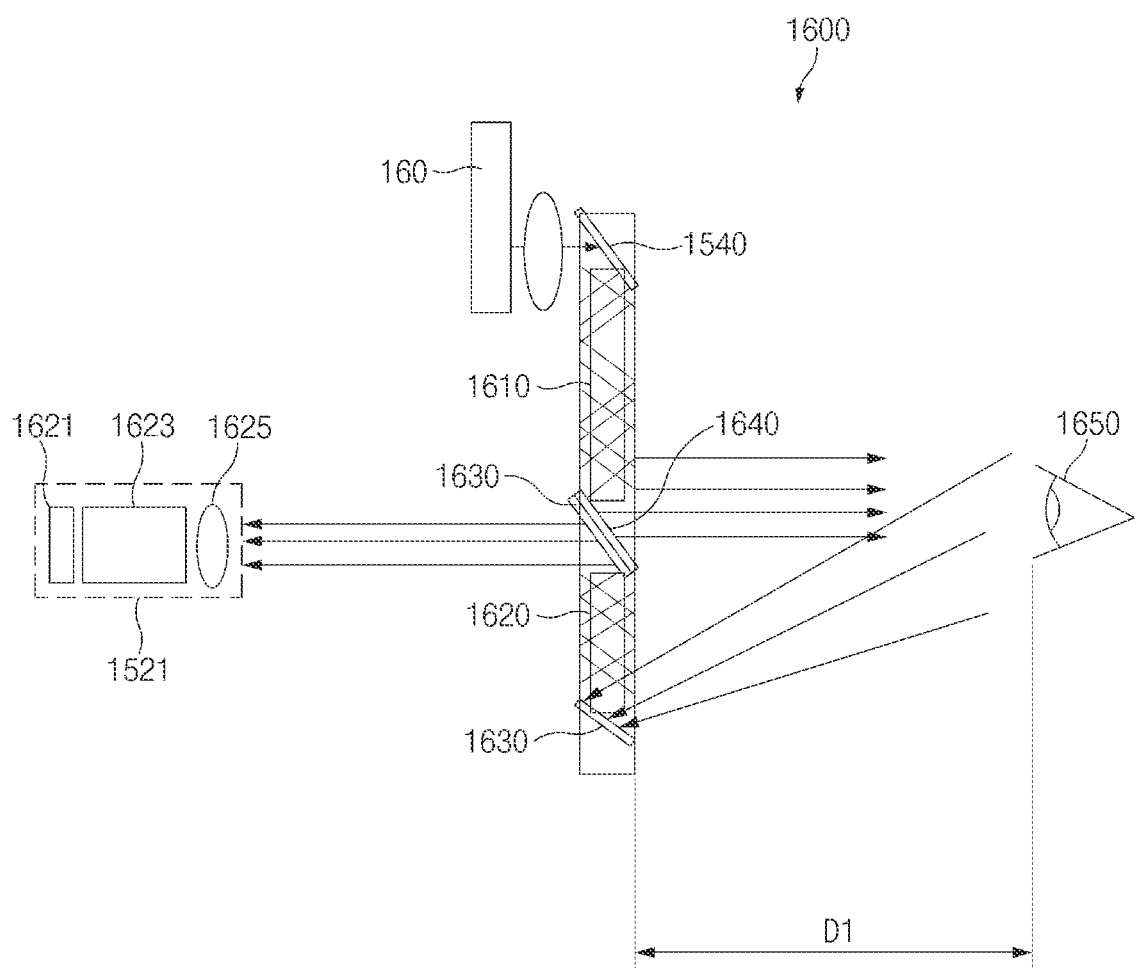
FIG. 16 is a diagram illustrating an optical structure of a wearable electronic device according to various embodiments.

FIG. 16 is a diagram 1600 illustrating an optical structure of a wearable electronic device (e.g., the electronic device 101 of FIG. 1) according to various embodiments.

In an embodiment, a first optical waveguide 1610 may be contained inside a glass lens (e.g., the glass lenses 211 and 212 of FIG. 15). The first optical waveguide 1610 may transfer light generated by a display 160 to an eye of a user. The first optical waveguide 1610 may be formed of glass, plastic, or polymer. The first optical waveguide 1610 may include a nano pattern formed on one surface inside or outside. The nano pattern may include a polygonal or curved grating structure.

In an embodiment, light output from the display 160 may be incident on one end of the first optical waveguide 1610 through an input optical member 1540. The light incident on the one end of the first optical waveguide 1610 may be propagated inside a second optical waveguide 1620, which is an optical waveguide of the display 160, by the nano pattern.

In an embodiment, the light propagated inside the second optical waveguide 1620 may be provided to the user. The second optical waveguide 1620 may include a free-form prism. The second optical waveguide 1620 may include at least one of a diffractive element (e.g., a diffractive optical element (DOE) or a holographic optical element (HOE)) or a reflective element (e.g., a reflective mirror). The second optical waveguide 1620 may guide the incident light to an eye 1650 of the user through the diffractive element or the reflective element to provide the light to the user.

In an embodiment, the diffractive element may include the input optical member 1540 and an output optical member 1640. The reflective element may include total internal reflection (TIR). For example, light emitted from the display 160 may be guided to the first optical waveguide 1610 through the input optical member 1540. The light travelling inside the first optical waveguide 1610 may be guided toward the eye 1650 of the user through the output optical member 1640. The user may view a screen according to the light emitted toward the eye 1650 of the user.

In an embodiment, the light propagated inside the second optical waveguide 1620 may be split through a beam splitter 1630. At least part of light split through the beam splitter 1630 may be guided to a second camera 1521. The second camera 1521 may process the light guided to the second camera 1521, using an ET sensor 1621, an ET optic member 1623, and a lens 1625.

A wearable electronic device (e.g., the electronic device 101 of FIG. 2) according to various example embodiments may include: a housing including a first housing part (e.g., the first housing part 210 of FIG. 2) in which a processor (e.g., the processor 120 of FIG. 4) is received and a second housing part (e.g., the second housing part 220 of FIG. 2) in which a display (e.g., the display module 160 of FIG. 1) is received, and a hinge (e.g., the hinge 440 of FIG. 4) connecting the first housing part and the second housing part and including a hole (e.g., the hole 260 of FIG. 4) provided in an area exposed outside the wearable electronic device, wherein the electronic device is configured to radiate at least part of heat generated from the processor to the outside through the hinge including the hole.

In an example embodiment, the hole may be substantially empty with no part inside in a state in which the hinge is connected with the first housing part and the second housing part.

In an example embodiment, the wearable electronic device may further include a conductive member (e.g., the conductive member 420 of FIG. 4) including a thermally conductive material received in the first housing part and connected with the hinge, wherein at least part of the heat generated from the processor may be transferred to the hinge through the conductive member.

In an example embodiment, the wearable electronic device may further include: a heat pipe (e.g., the heat pipe 910 of FIG. 9) received in the first housing part and connected with the conductive member, and at least another part of the heat may be radiated to the outside while being transferred to at least a portion of the first housing part through the heat pipe.

In an example embodiment, the conductive member may extend in a first direction with respect to the processor (e.g., the first direction D1 of FIG. 4) in which the first housing part and the second housing part are connected, the hole may be provided in a second direction (e.g., the second direction D2 of FIG. 4) substantially perpendicular to the first direction, and the heat pipe may extend in a direction different from the first direction and the second direction (e.g., the direction −D1 opposite to the first direction D1 of FIG. 9) with respect to the processor.

In an example embodiment, the conductive member may be disposed to cover at least part of the processor when viewed in a third direction (e.g., the third direction D3 of FIG. 4) perpendicular to the first direction and the second direction.

In an example embodiment, air outside the wearable electronic device may pass through an inner wall of the hole of the hinge in the second direction to radiate the heat generated from the processor to the outside.

In an example embodiment, the conductive member may transfer the heat generated from the processor to the hole.

In an example embodiment, the hinge and the conductive member may have a thermal conductivity greater than or equal to a specified first thermal conductivity, and the hinge may have a stiffness greater than or equal to a specified first stiffness.

In an example embodiment, the hinge may be integrally formed with the conductive member.

In an example embodiment, the wearable electronic device may further include: a heat conduction member (e.g., the heat conduction member 1110 of FIG. 11) including a thermally conductive material that covers at least part of the processor and a shielding member (e.g., the shielding member 1120 of FIG. 11) including a shielding material at least partially surrounding the processor covered by the heat conduction member, and the conductive member may be disposed on the shielding member.

In an example embodiment, the wearable electronic device may further include: an FPCB (e.g., the FPCB 450 of FIG. 4) electrically connecting the processor and the display.

In an example embodiment, the wearable electronic device may further include: a non-conductive member including a thermally non-conductive material surrounding the hinge. The electronic device may include an air permeable member including an air permeable material covering the hole, and the air permeable member may be exposed to the outside.

In an example embodiment, the hinge may comprise aluminum.

A wearable electronic device according to various example embodiments may include: a housing including a first housing part in which a processor is received and a second housing part in which a display is received, a hinge rotatably connecting the first housing part and the second housing part and having a hole provided therein, and an FPCB electrically connecting the display and the processor. The FPCB may be disposed to bypass the hinge, and configured to radiate heat generated from the processor outside the wearable electronic device through the hole.

In an example embodiment, the wearable electronic device may further include a conductive member including a thermally conductive material disposed between the processor and the hole.

In an example embodiment, the hinge may have a thermal conductivity greater than or equal to a specified first thermal conductivity and a stiffness greater than or equal to a specified first stiffness.

In an example embodiment, air outside the wearable electronic device may pass through an inner wall of the hole of the hinge to radiate the heat generated from the processor to the outside.

In an example embodiment, the wearable electronic device may further include a non-conductive member including a thermally non-conductive material surrounding the hinge. An air permeable member including an air permeable material may be disposed to cover the hole. The air permeable member may be exposed to the outside.

In an example embodiment, the hinge may comprise aluminum.

In an example embodiment, the wearable electronic device may further include: a heat conduction member including a thermally conductive material covering at least part of the processor and a shielding member including a shielding material that at least partially surrounds the processor covered by the heat conduction member.

The electronic device according to various embodiments may be one of various types of electronic devices. The electronic devices may include, for example, a portable communication device (e.g., a smartphone), a computer device, a portable multimedia device, a portable medical device, a camera, a wearable device, a home appliance, or the like. According to an embodiment of the disclosure, the electronic devices are not limited to those described above.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities, and some of the multiple entities may be separately disposed in different components. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. A wearable electronic device for wearing by a user, the wearable electronic device comprising:
    a first housing in which a processor is disposed and configured to be fixed to the user when the user wears the wearable electronic device, the first housing including a conductive member to cover at least a portion of the processor;
    a second housing including a rim to support a lens, wherein an image frame provided by a display is at least partially outputted to the lens; and
    a hinge connecting the first housing and the second housing and configured to enable rotation of the first housing relative to the second housing about a rotation axis, the hinge having an open through hole provided along the rotational axis,
    wherein at least part of heat generated from the processor exits the wearable electronic device through the open through hole to an outside of the wearable electronic device.

2. The wearable electronic device of claim 1, wherein the hole is substantially open.

3. The wearable electronic device of claim 1, wherein
    the conductive member is configured to transfer at least part of the heat generated from the processor to the hinge.

4. The wearable electronic device of claim 3, further comprising:
    a heat pipe disposed in the first housing and connected with the conductive member,
    wherein the heat pipe is configured to radiate at least another part of the heat to the outside of the wearable electronic device while the at least another part of the heat is being transferred to at least a portion of the first housing through the heat pipe.

5. The wearable electronic device of claim 4, wherein the conductive member extends, with respect to the processor, in a first direction in which the first housing and the second housing are connected, and
    wherein the heat pipe extends in a direction different from the first direction with respect to the processor.

6. The wearable electronic device of claim 5, wherein the conductive member is disposed to cover at least part of the processor when viewed in a direction perpendicular to the first direction.

7. The wearable electronic device of claim 5, wherein the electronic device is configured to pass air from the outside of the wearable electronic device through an inner wall of the open through hole to radiate the heat generated from the processor to the outside.

8. The wearable electronic device of claim 3, wherein the conductive member is configured to transfer the heat generated from the processor to the open through hole.

9. The wearable electronic device of claim 3, wherein the hinge and the conductive member have a thermal conductivity greater than or equal to a specified first thermal conductivity, and
wherein the hinge has a stiffness greater than or equal to a specified first stiffness.

10. The wearable electronic device of claim 3, wherein the hinge is integrally formed with the conductive member.

11. The wearable electronic device of claim 1, further comprising:
a heat conduction member including a thermally conductive material configured to cover at least part of the processor; and
a shield including a shield material configured to at least partially surround the processor covered by the heat conduction member,
wherein the conductive member is disposed on the shield.

12. The wearable electronic device of claim 1, further comprising:
a flexible printed circuit board (FPCB) electrically connecting the processor and the display.

13. The wearable electronic device of claim 1, further comprising: a non-conductive member including a thermally non-conductive material at least partially surrounding the hinge, and an air permeable member including an air permeable material covering the open through hole, the air permeable member being exposed to the outside of the wearable electronic device.

14. The wearable electronic device of claim 1, wherein the hinge comprises aluminum.

15. A wearable electronic device for wearing by a user, the wearable electronic device comprising:
a first housing in which a processor is disposed and configured to be fixed on the user when the user wears the wearable electronic device, the first housing including a conductive material to cover at least a portion of the processor;
a second housing including a rim to support a lens, wherein an image frame provided by a display is at least partially outputted to the lens;
a hinge connecting the first housing and the second housing and configured to enable rotation of the first housing relative to the second housing about a rotation axis, the hinge including an open through hole provided along the rotation axis; and
a flexible printed circuit board (FPCB) electrically connecting the display and the processor,
wherein the FPCB is disposed to bypass the hinge, and
wherein at least part of heat generated from the processor exits the wearable electronic device through the open through hole to an outside of the wearable electronic device.

* * * * *